(12) United States Patent
Lee et al.

(10) Patent No.: US 9,640,580 B2
(45) Date of Patent: May 2, 2017

(54) IMAGE SENSOR PACKAGES AND METHODS OF FABRICATING THE SAME

(71) Applicant: SK hynix Inc., Icheon (KR)

(72) Inventors: Seung Hyun Lee, Suwon (KR); Na Yeon Kim, Seoul (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/788,666

(22) Filed: Jun. 30, 2015

(65) Prior Publication Data
US 2016/0218136 A1    Jul. 28, 2016

(30) Foreign Application Priority Data
Jan. 22, 2015    (KR) .......................... 10-2015-0010835

(51) Int. Cl.
*H01L 31/02*    (2006.01)
*H01L 23/528*   (2006.01)
(Continued)

(52) U.S. Cl.
CPC ........ *H01L 27/14636* (2013.01); *H01L 24/02* (2013.01); *H01L 24/03* (2013.01); *H01L 24/05* (2013.01); *H01L 24/29* (2013.01); *H01L 24/73* (2013.01); *H01L 24/92* (2013.01); *H01L 24/94* (2013.01); *H01L 27/14618* (2013.01); *H01L 27/14645* (2013.01); *H01L 29/06* (2013.01); *H01L 31/0203* (2013.01); *H01L 31/02005* (2013.01); *H01L 31/02327* (2013.01); *H01L 24/13* (2013.01); *H01L 24/32* (2013.01); *H01L 27/14621* (2013.01); *H01L 2224/024* (2013.01); *H01L 2224/0235* (2013.01); *H01L 2224/0236* (2013.01); *H01L 2224/0239* (2013.01); *H01L 2224/02311* (2013.01); *H01L 2224/02313* (2013.01); *H01L 2224/02331* (2013.01);
(Continued)

(58) Field of Classification Search
CPC ......... H01L 27/14636; H01L 27/14645; H01L 23/42; H01L 23/5226; H01L 23/5386; H01L 24/02; H01L 31/02005; H01L 31/02327; H01L 31/0203
USPC ............ 257/82, 417, 432, 692, 773, E23.01, 257/E23.021, E23.051, E21.122, E21.499, 257/E21.597; 438/25, 51, 65
See application file for complete search history.

(56) References Cited

U.S. PATENT DOCUMENTS 8,309,384 B2 * 11/2012 Leib ................. H01L 21/50
                                                257/E21.597
8,741,683 B2 *  6/2014 Huang ............. H01L 23/3171
                                                      257/433
(Continued)

*Primary Examiner* — Dao H Nguyen

(57) ABSTRACT

An image sensor package includes a die having an active side surface and a backside surface opposite to each other and having a bonding pad disposed on the active side surface, a through via penetrating the die and being electrically connected to the bonding pad, and a first dielectric layer disposed between the through via and the die. The first dielectric layer extends to cover the backside surface of the die. A redistribution line is disposed on the first dielectric layer and is electrically connected to the through via. The redistribution line extends onto the first dielectric layer on the backside surface of the die. A second dielectric layer is disposed on the first dielectric layer to cover the redistribution line and to extend onto an outer sidewall of the die. Related methods are also provided.

10 Claims, 27 Drawing Sheets

(51) Int. Cl.
*H01L 23/538* (2006.01)
*H01L 27/146* (2006.01)
*H01L 23/00* (2006.01)
*H01L 31/0232* (2014.01)
*H01L 31/0203* (2014.01)
*H01L 29/06* (2006.01)

(52) U.S. Cl.
CPC ......... *H01L 2224/02351* (2013.01); *H01L 2224/02371* (2013.01); *H01L 2224/02372* (2013.01); *H01L 2224/02377* (2013.01); *H01L 2224/0383* (2013.01); *H01L 2224/03831* (2013.01); *H01L 2224/0401* (2013.01); *H01L 2224/05155* (2013.01); *H01L 2224/05548* (2013.01); *H01L 2224/05551* (2013.01); *H01L 2224/05624* (2013.01); *H01L 2224/05644* (2013.01); *H01L 2224/05647* (2013.01); *H01L 2224/05655* (2013.01); *H01L 2224/131* (2013.01); *H01L 2224/13024* (2013.01); *H01L 2224/29011* (2013.01); *H01L 2224/2919* (2013.01); *H01L 2224/29082* (2013.01); *H01L 2224/32225* (2013.01); *H01L 2224/73253* (2013.01); *H01L 2224/92* (2013.01); *H01L 2224/94* (2013.01); *H01L 2924/10158* (2013.01)

(56) References Cited

U.S. PATENT DOCUMENTS

| | | | |
|---|---|---|---|
| 2010/0171189 A1* | 7/2010 | Liu | B81C 1/00301 |
| | | | 257/417 |
| 2010/0187697 A1* | 7/2010 | Tsai | H01L 21/76898 |
| | | | 257/773 |
| 2011/0227186 A1 | 9/2011 | Chang et al. | |
| 2012/0062439 A1 | 3/2012 | Liao et al. | |
| 2013/0153933 A1* | 6/2013 | Lee | H01L 31/1876 |
| | | | 257/82 |
| 2015/0137341 A1* | 5/2015 | Liu | H01L 27/14636 |
| | | | 257/692 |
| 2016/0190353 A1* | 6/2016 | Liao | H01L 31/02005 |
| | | | 257/432 |

* cited by examiner

IMAGE SENSOR PACKAGES AND METHODS OF FABRICATING THE SAME

CROSS-REFERENCE TO RELATED APPLICATION

The present application claims priority under 35 U.S.C 119(a) to Korean Application No. 10-2015-0010835, filed on Jan. 22, 2015, in the Korean Intellectual Property Office, the disclosure of which is incorporated herein by reference in its entirety.

BACKGROUND

1. Technical Field

Embodiments of the present disclosure relate to semiconductor packages and methods of fabricating the same and, more particularly, to image sensor packages and methods of fabricating the same.

2. Related Art

Image sensors are widely used to generate image data in mobile phones, computers, digital cameras, digital camcorders, or the like. In particular, complementary metal-oxide-semiconductor (CMOS) image sensors are widely employed to convert light reflecting from objects into electrical signals. Recently, the CMOS image sensors have been packaged using wafer level package technologies to improve the production yield. In addition, various attempts to apply through silicon vias (TSVs) to the CMOS image sensor packages have been proposed to improve design schemes of interconnection lines.

SUMMARY

Various embodiments are directed to image sensor packages and methods of fabricating the same.

According to an embodiment, an image sensor package includes an image sensor die having an active side surface and a backside surface that are opposite to each other. The image sensor die includes a die body portion, a terrace portion thinner than the die body portion, and a bonding pad disposed on the active side surface. A through via penetrates the terrace portion and is electrically connected to the bonding pad. A first dielectric layer is disposed between the through via and the terrace portion, and the first dielectric layer extends to cover the backside surfaces of the die body portion and the terrace portion. A redistribution line is disposed on the first dielectric layer and is electrically connected to the through via. The redistribution line extends onto the first dielectric layer disposed on the backside surface of the terrace portion. A second dielectric layer is disposed on the first dielectric layer to cover the redistribution line and to extend onto a sidewall of the terrace portion. The active side surface includes an image sensor device region.

According to another embodiment, an image sensor package includes an image sensor die having an active side surface and a backside surface that are opposite to each other. The image sensor die includes a die body portion, an edge portion, and a bonding pad disposed on the active side surface. A through via penetrates the edge portion and is electrically connected to the bonding pad. A first dielectric layer is disposed between the through via and the edge portion, and the first dielectric layer extends to cover the backside surfaces of the die body portion and the edge portion. A redistribution line is disposed on the first dielectric layer and is electrically connected to the through via. The redistribution line extends onto the first dielectric layer disposed on the backside surface of the edge portion. A second dielectric layer is disposed on the first dielectric layer to cover the redistribution line and to extend onto an outer sidewall of the edge portion. A second dielectric layer is disposed on the first dielectric layer to cover the redistribution line and to extend onto an outer sidewall of the edge portion. The active side surface includes an image sensor device region.

According to another embodiment, an image sensor package includes a die having an active side surface and a backside surface that are opposite to each other and having a bonding pad that is disposed on the active side surface, a through via penetrating the die and being electrically connected to the bonding pad, and a first dielectric layer disposed between the through via and the die. The first dielectric layer extends to cover the backside surface of the die. A redistribution line is disposed on the first dielectric layer and is electrically connected to the through via, and the redistribution line extends onto the first dielectric layer disposed on the backside surface of the die. A second dielectric layer is disposed on the first dielectric layer to cover the redistribution line and to extend onto an outer sidewall of the die.

According to another embodiment, there is provided a method of fabricating an image sensor package. The method includes providing a wafer including a plurality of image sensor dies. Each image sensor die is formed to have an active side surface and a backside surface that are opposite to each other and to include a die body portion, an edge portion, and a bonding pad on the active side surface. An etch process is applied to the backside surfaces of the edge portions of the image sensor dies to form a terrace portion in each of the image sensor die. Through holes penetrating the terrace portions are formed to expose the bonding pads. The terrace portions are patterned to form a half cut trench having sidewalls that correspond to outer sidewalls of the terrace portions. A first dielectric layer is formed on the die body portions, the terrace portions and the bonding pads. The first dielectric layer is patterned to expose the bonding pads. Through vias and redistribution lines connected to the bonding pads are formed on the first dielectric layer. A second dielectric layer is formed on the first dielectric layer to cover the redistribution lines, the through vias, and the outer sidewalls of the terrace portions.

According to another embodiment, there is provided an electronic system including a semiconductor package. The semiconductor package includes an image sensor die having an active side surface and a backside surface that are opposite to each other. The image sensor die includes a die body portion, a terrace portion thinner than the die body portion, and a bonding pad disposed on the active side surface. A through via penetrates the terrace portion and is electrically connected to the bonding pad. A first dielectric layer is disposed between the through via and the terrace portion, and the first dielectric layer extends to cover the backside surfaces of the die body portion and the terrace portion. A redistribution line is disposed on the first dielectric layer and is electrically connected to the through via. The redistribution line extends onto the first dielectric layer disposed on the backside surface of the terrace portion. A second dielectric layer is disposed on the first dielectric layer to cover the redistribution line and to extend onto a sidewall of the terrace portion. The active side surface includes an image sensor device region.

According to another embodiment, there is provided an electronic system including a semiconductor package. The semiconductor package includes an image sensor die having an active side surface and a backside surface that are opposite to each other. The image sensor die includes a die body portion, an edge portion, and a bonding pad disposed on the active side surface. A through via penetrates the edge portion and is electrically connected to the bonding pad. A first dielectric layer is disposed between the through via and the edge portion, and the first dielectric layer extends to cover the backside surfaces of the die body portion and the edge portion. A redistribution line is disposed on the first dielectric layer and is electrically connected to the through via. The redistribution line extends onto the first dielectric layer disposed on the backside surface of the edge portion. A second dielectric layer is disposed on the first dielectric layer to cover the redistribution line and to extend onto an outer sidewall of the edge portion. A second dielectric layer is disposed on the first dielectric layer to cover the redistribution line and to extend onto an outer sidewall of the edge portion. The active side surface includes an image sensor device region.

According to another embodiment, there is provided an electronic system including a semiconductor package. The semiconductor package includes a die having an active side surface and a backside surface that are opposite to each other and having a bonding pad that is disposed on the active side surface, a through via penetrating the die and being electrically connected to the bonding pad, and a first dielectric layer disposed between the through via and the die. The first dielectric layer extends to cover the backside surface of the die. A redistribution line is disposed on the first dielectric layer and is electrically connected to the through via, and the redistribution line extends onto the first dielectric layer disposed on the backside surface of the die. A second dielectric layer is disposed on the first dielectric layer to cover the redistribution line and to extend onto an outer sidewall of the die.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present disclosure.

It will also be understood that when an element is referred to as being located "on", "over", "above", "under", "beneath" or "below" another element, it may directly contact the other element, or at least one intervening element may be present therebetween. Accordingly, the terms such as "on", "over", "above", "under", "beneath", "below" and the like that are used herein are for the purpose of describing particular embodiments only and are not intended to limit the scope of the present disclosure.

It will be further understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

Figure 1:
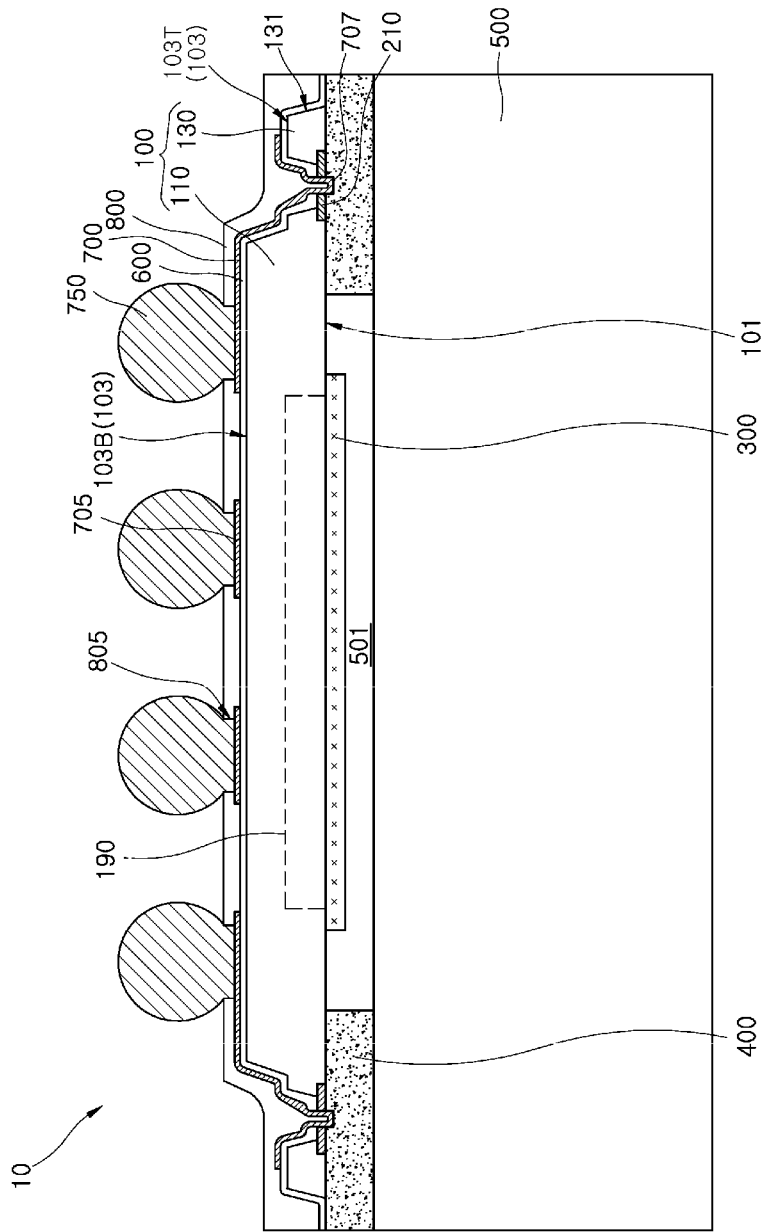
FIG. 1 is a cross-sectional view illustrating an image sensor package according to an embodiment.
Figure 2:
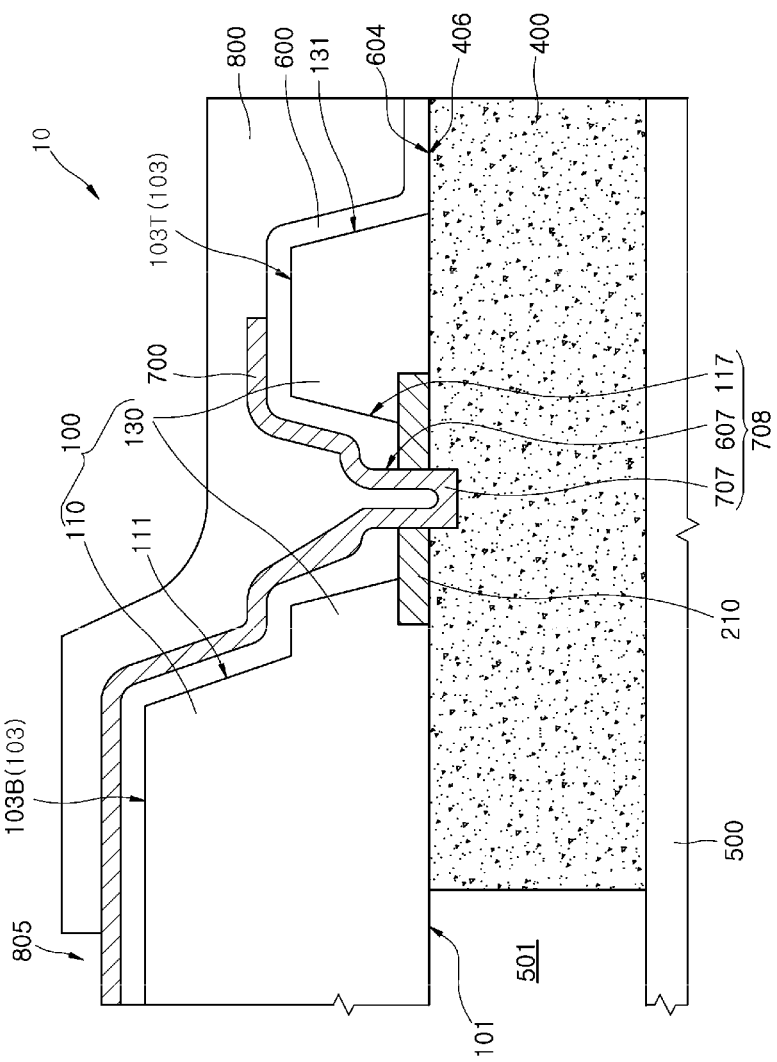
FIG. 2 is a cross-sectional view illustrating an edge of the image sensor package shown in FIG. 1.
Figure 3:
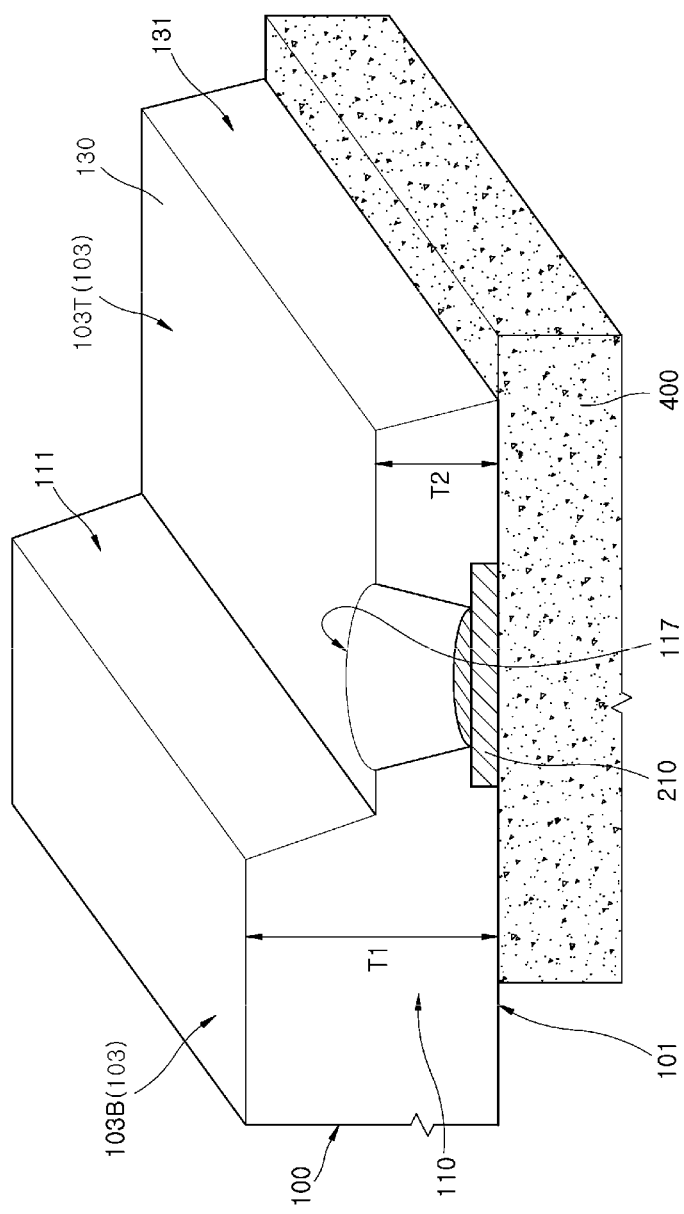
FIG. 3 is a perspective view illustrating an edge of the image sensor die included in the image sensor package shown in FIG. 1.

FIG. 1 is a cross-sectional view illustrating an image sensor package 10 according to an embodiment. FIG. 2 is an enlarged cross-sectional view of an edge of the image sensor package 10 shown in FIG. 1. FIG. 3 is a perspective view illustrating an edge of an image sensor die 100 included in the image sensor package 10 of FIG. 1.

Referring to FIG. 1, the image sensor package 10 may include the image sensor die 100. The image sensor die 100 may correspond to a semiconductor substrate or a semiconductor chip in which a device converting optical images into electrical signals is integrated. The image sensor die 100 may be a semiconductor chip in which a CMOS image sensor circuit is integrated. The image sensor package 10 may have substantially the same size as the image sensor die 100 or a similar size to the image sensor die 100. That is, the image sensor package 10 may be realized using a chip scale package technique.

The image sensor die 100 may have an active side surface 101 and a backside surface 103 that are opposite to each other. The image sensor die 100 may also have outer sidewalls 131 that connect edge sides of the active side surface 101 to edge sides of the backside surface 103. The image sensor die 100 may have an image sensor device region 190 which is defined at a central portion of the active side surface 101. Bonding pads 210 may be disposed on edges of the active side surface 101 of the image sensor die 100.

The image sensor device region 190 may correspond to an image sensing region in which a photoelectric conversion device, for example, a CMOS image sensor device is integrated. Peripheral circuits (not shown) for driving the photoelectric conversion device may be disposed on the active side surface 101 to be adjacent to the image sensor device region 190. In addition, internal interconnection lines (not shown) electrically connected to the photoelectric conversion device or the peripheral circuits may be disposed on the edges of the active side surface 101. The internal interconnection lines may have a multi-layered metal interconnection structure. The bonding pads 210 may be disposed on edges of the active side surface 101 to electrically connect the internal interconnection lines to external devices or external circuits.

Referring to FIGS. 1, 2 and 3, the image sensor die 100 may include a die body portion 110 and a terrace portion 130 surrounding sidewalls of the die body portion 110. The image sensor device region 190 may be disposed in the die body portion 110, and the bonding pads 210 may be disposed on the active side surface 101 of the terrace portion 130.

The terrace portion 130 may have a thickness T2 which is less than a thickness T1 of the die body portion 110. A backside surface 103T of the terrace portion 130 may be stepped down from a backside surface 103B of the die body portion 110. As a result, a level of the backside surface 103T of the terrace portion 130 may be lower than a level of the backside surface 103B of the die body portion 110. Accordingly, a sloped sidewall 111 may exist between the terrace portion 130 and the die body portion 110.

As illustrated in FIG. 1, an optical lid 500 may be disposed on the active side surface 101 of the image sensor die 100. The optical lid 500 may include a transparent material, for example, an optical grade glass material or a quartz material. A dam-like support structure 400 may be disposed between the image sensor die 100 and the optical lid 500.

As illustrated in FIGS. 1 and 2, the dam-like support structure 400 may cover an edge of the image sensor die 100, for example, the active side surface 101 of the terrace portion 130 and may laterally extend toward an outer edge of the image sensor die 100. As illustrated in FIG. 3, the dam-like support structure 400 may laterally extend to an outer edge of the image sensor die 100 so that a top surface of the dam-like support structure 400 directly contacts a lower portion of the outer sidewalls 131 of the image sensor die 100, and the extended portion of the dam-like support structure 400 may extend past the outside edge of the image sensor die 100. The dam-like support structure 400 may cover the edges of the image sensor die 100 and the bonding pads 210 on the edges of the active side surface 101. Accordingly, a cavity 501 may be provided between the optical lid 500 and a central portion of the active side surface 101 of the image sensor die 100.

The dam-like support structure 400 may include an epoxy resin material, a polyimide material, a photoresist material or a solder resist material. The dam-like support structure 400 may be attached to the image sensor die 100 using an adhesive agent (not shown). The optical lid 500 may also be attached to the dam-like support structure 400 using an adhesive agent (not shown). Accordingly, the active side surface 101 of the image sensor die 100 may be completely covered with the optical lid 500 and the dam-like support structure 400 to be isolated from an external environment.

The image sensor device region 190 may be exposed to the cavity 501 which is provided by the dam-like support structure 400. External light passing through the optical lid 500 may be irradiated onto the image sensor device disposed in the image sensor device region 190, and the image sensor device may receive the external light and generate electrical signals corresponding to image data. A color filter array 300 may be disposed in the cavity 501 and cover the image sensor device region 190. Although not shown in the drawings, an optical member such as a micro lens array may be additionally disposed on the color filter array 300.

The image sensor package 10 may include through via structures 708 such as through silicon vias (TSVs). As illustrated in FIGS. 1 and 2, each of the through via structures 708 may include a conductive through via 707 substantially penetrating the terrace portion 130 of the image sensor die 100. The conductive through via 707 may substantially pass through the terrace portion 130 of the image sensor die 100 and may be electrically connected to one of the bonding pads 210.

The backside surface 103 of the image sensor die 100 may be covered with a first dielectric layer 600. The first dielectric layer 600 may electrically isolate or insulate the conductive through via 707 from the terrace portion 130 of the image sensor die 100. The first dielectric layer 600 may cover the backside surface 103 of the image sensor die 100 to act as a passivation layer that substantially encapsulates the image sensor die 100. The first dielectric layer 600 may include an insulation layer containing silicon elements, for example, a silicon oxide material or a silicon nitride material. However, the first dielectric layer 600 is not limited to the silicon oxide material or the silicon nitride material. For example, in some embodiments, the first dielectric layer 600 may include an organic polymer material.

Referring to FIG. 2, the conductive through via 707 may be electrically insulated from the die body portion 110 and the terrace portion 130 by the first dielectric layer 600. The conductive through via 707 may be disposed in a first via hole 117 that penetrates the terrace portion 130. The first via hole 117 may correspond to a through hole that exposes a portion of a backside surface of the bonding pad 210 opposite to the dam-like support structure 400. Since the terrace portion 130 is thinner than the die body portion 110, a substantial depth of the first via hole 117 penetrating the terrace portion 130 may be less than a thickness of the die body portion 110. The first dielectric layer 600 may extend to cover a sidewall of the first via hole 117 and a portion of the backside surface of the bonding pad 210. The first dielectric layer 600 covering the backside surface 103B of the die body portion 110 may extend onto the sloped sidewall 111 and the backside surface 103T of the terrace portion 130. The first dielectric layer 600 may extend onto the sidewall of the first via hole 117 penetrating the terrace portion 130 to electrically isolate the conductive through via 707 from the terrace portion 130.

Referring again to FIG. 2, the conductive through via 707 may substantially penetrate the first dielectric layer 600. The conductive through via 707 may be disposed in a second via hole 607 that penetrates the first dielectric layer 600 covering a bottom surface of the first via hole 117. The conductive through via 707 may extend along a sidewall of the second via hole 607 to constitute the through via structure 708 which is connected to the bonding pad 210.

The conductive through via 707 may extend to penetrate the bonding pad 210. The conductive through via 707 may vertically pass through the bonding pad 210 to contact a surface of the dam-like support structure 400 or to extend into the dam-like support structure 400. Thus, the bonding pad 210 may be connected to an outer sidewall of the conductive through via 707. Accordingly, a joint portion of the conductive through via 707 and the bonding pad 210 may have a "T"-shaped cross-sectional view. In order that a lower portion of the conductive through via 707 penetrates the bonding pad 210 or extends into the dam-like support structure 400, the second via hole 607 in which the conductive through via 707 is disposed may penetrate the first dielectric layer 600 and the bonding pad 210. In addition, the second via hole 607 may extend into the dam-like support structure 400. Accordingly, the conductive through via 707 disposed in the second via hole 607 may penetrate the first dielectric layer 600, and a portion of the conductive through via 707 may be buried in the dam-like support structure 400. The through via structure 708 including the conductive through via 707 and the first and second via holes 117 and

607 may provide a reliable connection structure between the bonding pad 210 and the conductive through via 707.

Referring again to FIGS. 1 and 2, the image sensor package 10 may further include redistribution lines 700 that are disposed on the first dielectric layer 600 and are electrically connected to the conductive through vias 707. The redistribution lines 700 may extend onto the backside surface 103 of the image sensor die 100. Each of the redistribution lines 700 may include a solder pad 705 on which an external connection member such a solder ball 750 is disposed. Accordingly, the redistribution lines 700 may act as interconnection lines that electrically connect the solder balls 750 to the conductive through vias 707. The redistribution lines 700 may include the same conductive material as the conductive through vias 707. Each of the redistribution lines 700 may extend from one of the conductive through vias 707 to cover a portion of the terrace portion 130, a portion of the sloped sidewall 111, and a portion of the backside surface 103B of the die body portion 110.

Each of the redistribution lines 700 may have a circuit trace pattern shape and include a copper material or an aluminum material. Each of the solder pads 705 may further include a metal material that is suitable for soldering. For example, each of the solder pads 705 may include a copper layer, an aluminum layer, a nickel layer, a gold layer, or a combination thereof. The nickel layer included in each solder pad 705 may act as a solder barrier layer, and the gold layer included in each solder pad 705 may act as an oxidation barrier layer.

Referring yet again to FIGS. 1 and 2, the image sensor package 10 may further include a second dielectric layer 800 that is disposed on the backside surface 103 of the image sensor die 100 to cover the first dielectric layer 600 and the redistribution lines 700. The second dielectric layer 800 may encapsulate the image sensor die 100. The second dielectric layer 800 may have a solder mask shape that covers portions of the redistribution lines 700 except the solder pads 705. That is, the second dielectric layer 800 may have openings 805 that expose the solder pads 705. The second dielectric layer 800 may include an organic polymer layer containing a solder resist material. The second dielectric layer 800 may protect the image sensor die 100 together with the first dielectric layer 600.

As illustrated in FIG. 2, the first and second dielectric layers 600 and 800 may cover the backside surface 103 and the outer sidewalls 131 of the image sensor die 100 and may extend past an outer edge of the image sensor die 100 onto a surface of the dam-like support structure 400. A surface 406 of the dam-like support structure 400 and a surface 604 of the first dielectric layer 600 may be in direct contact with each other past the edge of the image sensor die 100. A double-layered structure of the first and second dielectric layers 600 and 800 may isolate the image sensor die 100 from an external environment. Since the terrace portion 130 of the image sensor die 100 is isolated from an external environment by the double-layered structure of the first and second dielectric layers 600 and 800, the double-layered structure of the first and second dielectric layers 600 and 800 may prevent cracks from forming in a silicon material of the terrace portion 130 even though the external environment varies.

A thermal expansion coefficient of the terrace portion 130 may be different from thermal expansion coefficient of the dam-like support structure 400. Thus, if the external environment varies, a stress may be concentrated at interfaces between the terrace portion 130 and the dam-like support structure 400. However, a part of the terrace portion 130 corresponding to an edge of the image sensor die 100 may be sealed with the double-layered structure of the first and second dielectric layers 600 and 800. Thus, the stress generated at interfaces between the terrace portion 130 and the dam-like support structure 400 may be alleviated or absorbed by the double-layered structure of the first and second dielectric layers 600 and 800. As a result, the double-layered structure of the first and second dielectric layers 600 and 800 may prevent cracks from forming in a silicon material of the terrace portion 130. In contrast, if a portion of the terrace portion 130 is not sealed and is exposed to the external environment, a stress may be concentrated between the exposed portion of the terrace portion 130 and the dam-like support structure 400. In such a case, cracks may be initiated from the end of the terrace portion 130 and may be spread into the image sensor die 100 due to the stress.

Figure 4:
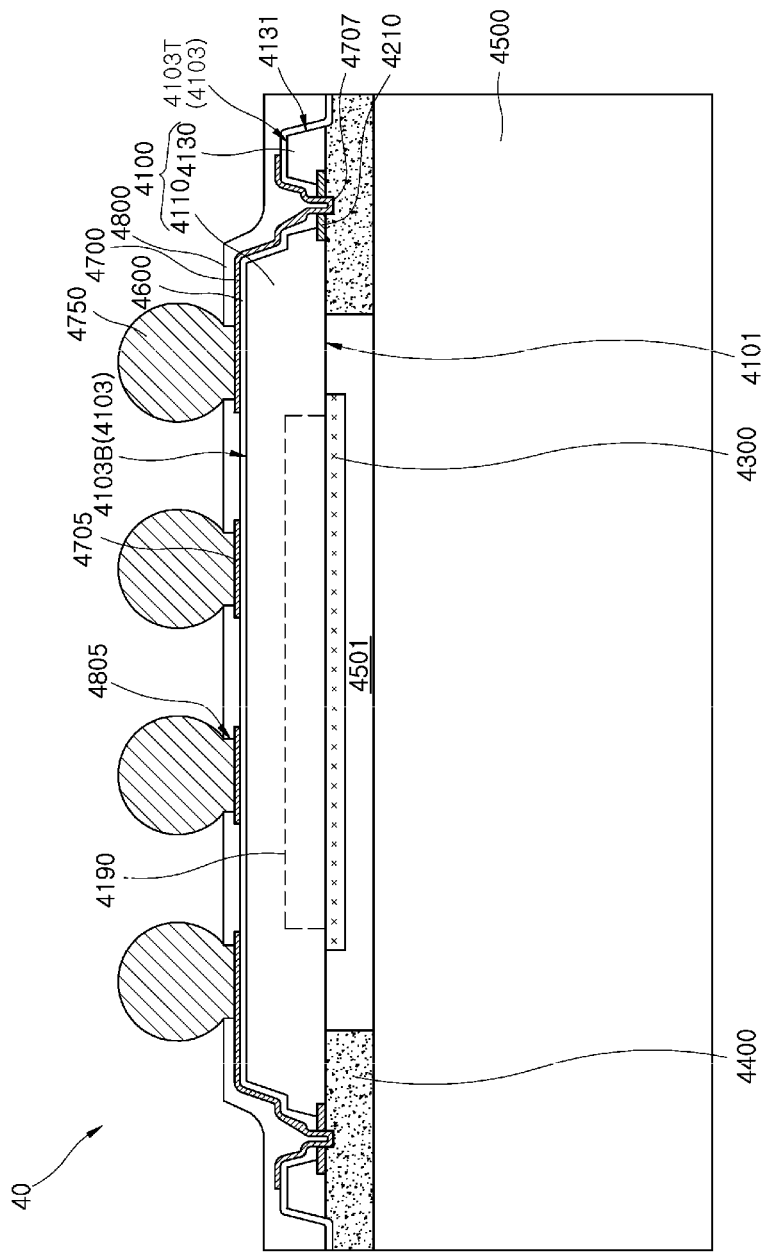
FIGS. 4 and 5 are cross-sectional views illustrating an image sensor package according to another embodiment.
Figure 5:
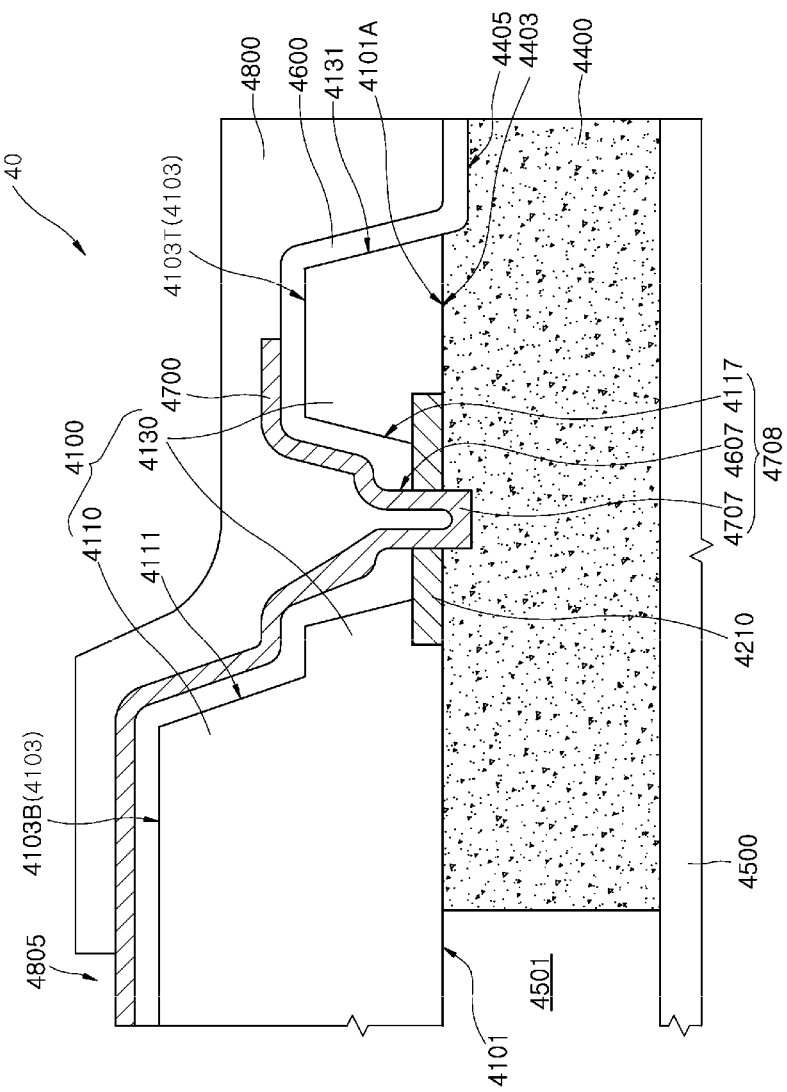

FIG. 4 is a cross-sectional view illustrating an image sensor package 40 according to another embodiment, and FIG. 5 is a cross-sectional view illustrating an edge of the image sensor package 40 shown in FIG. 4.

Referring to FIGS. 4 and 5, the image sensor package 40 may include an image sensor die 4100. The image sensor die 4100 may include a die body portion 4110 and a terrace portion 4130 surrounding sidewalls of the die body portion 4110. A thickness of the terrace portion 4130 may be less than a thickness of the die body portion 4110. Accordingly, a sloped sidewall 4111 may exist between the terrace portion 4130 and the die body portion 4110. The image sensor die 4100 may have an active side surface 4101 and a backside surface 4103 that are opposite to each other. The image sensor die 4100 may also have an image sensor device region 4190 which is defined at a central portion of the active side surface 4101. Bonding pads 4210 may be disposed on edges of the active side surface 4101 of the image sensor die 4100. An optical lid 4500 may be disposed on the active side surface 4101 of the image sensor die 4100, and a dam-like support structure 4400 may be disposed between the image sensor die 4100 and the optical lid 4500. The dam-like support structure 4400 may cover an edge of the image sensor die 4100, for example, the active side surface 4101 of the terrace portion 4130, thereby providing a cavity 4501 between the optical lid 4500 and a central portion of the active side surface 4101 of the image sensor die 4100. The dam-like support structure 4400 may also cover the bonding pads 4210 formed on the edge of the image sensor die 4100.

The image sensor package 40 may include through via structures 4708. Each of the through via structures 4708 may include a conductive through via 4707, a first via hole 4117 and a second via hole 4607. The conductive through via 4707 may be electrically connected to the bonding pad 4210 and may be physically connected to a redistribution line 4700.

The image sensor package 40 may also include a double-layered structure comprised of a first dielectric layer 4600 and a second dielectric layer 4800. The double-layered structure of the first and second dielectric layers 4600 and 4800 may cover a backside surface 4103B of the die body portion 4110 and a backside surface 4103T of the terrace portion 4130 and may extend onto outer sidewalls 4131 of the terrace portion 4130 to isolate the image sensor die 4100 from an external environment. The first and second dielectric layers 4600 and 4800 may contact the backside surface 4103 and the outer sidewalls 4131 of the image sensor die 4100 to seal the image sensor die 4100.

As illustrated in FIGS. 4 and 5, the first and second dielectric layers 4600 and 4800 may cover the outer sidewalls 4131 of the terrace portion 4130 of the image sensor die 4100 and may extend to cover a surface of the dam-like support structure 4400 which is exposed past the outer edge of the image sensor die 4100. In such a case, a surface of the dam-like support structure 4400 may be recessed to provide a groove region 4405. Thus, the portion of the first dielectric layer 4600 in the groove region 4405 may cover a surface 4403 of the dam-like support structure 4400 and a surface 4101A of the terrace portion 4130 of the image sensor die 4100, thereby isolating the terrace portion 4130 from an external environment.

Since the terrace portion 4130 of the image sensor die 4100 is isolated from an external environment by the double-layered structure of the first and second dielectric layers 4600 and 4800, the double-layered structure of the first and second dielectric layers 4600 and 4800 may prevent cracks from forming in a silicon material of the terrace portion 4130 even though the external environment varies. That is, because the interface between a surface 4403 of the dam-like support structure 4400 and a surface 4101A of the terrace portion 4130 of the image sensor die 4100 is isolated from the external environment by the first and second dielectric layers 4600 and 4800, the first and second dielectric layers 4600 and 4800 may absorb or alleviate a stress concentrated at the interface between the terrace portion 4130 and the dam-like support structure 4400. As a result, the double-layered structure of the first and second dielectric layers 4600 and 4800 may prevent cracks from forming in a silicon material of the terrace portion 4130.

In some embodiments, only one of the first and second dielectric layers 4600 and 4800 may extend to fill the groove region 4405 provided in the dam-like support structure 4400. For example, only a portion of the first dielectric layer 4600 may fill the groove region 4405 or the second dielectric layer 4800 may extend into the groove region 4405 to directly contact the dam-like support structure 4400. Even though only a portion of the first dielectric layer 4600 or only a portion of the second dielectric layer 4800 extends into the groove region 4405, the interface between the terrace portion 4130 and the dam-like support structure 4400 may be covered with the first or second dielectric layer 4600 or 4800. Thus, the first or second dielectric layer 4600 or 4800 may suppress cracks in a silicon material of the terrace portion 4130 of the image sensor die 4100. The second dielectric layer 4800 may have a solder mask shape including openings 4805 that expose solder pads 4705 of the redistribution lines 4700.

Each of the redistribution lines 4700 may be disposed on the first dielectric layer 4600 and may be electrically connected to one of the conductive through vias 4707. The redistribution lines 4700 may extend onto the backside surface 4103 of the image sensor die 4100. Each of the redistribution lines 4700 may include the solder pad 4705 on which an external connection member such as a solder ball 4750 is disposed. Accordingly, the redistribution lines 4700 may act as interconnection lines that electrically connect the solder balls 4750 to the conductive through vias 4707. A color filter array 4300 may be disposed in the cavity 4501 to cover the image sensor device region 4190.

Figure 6:
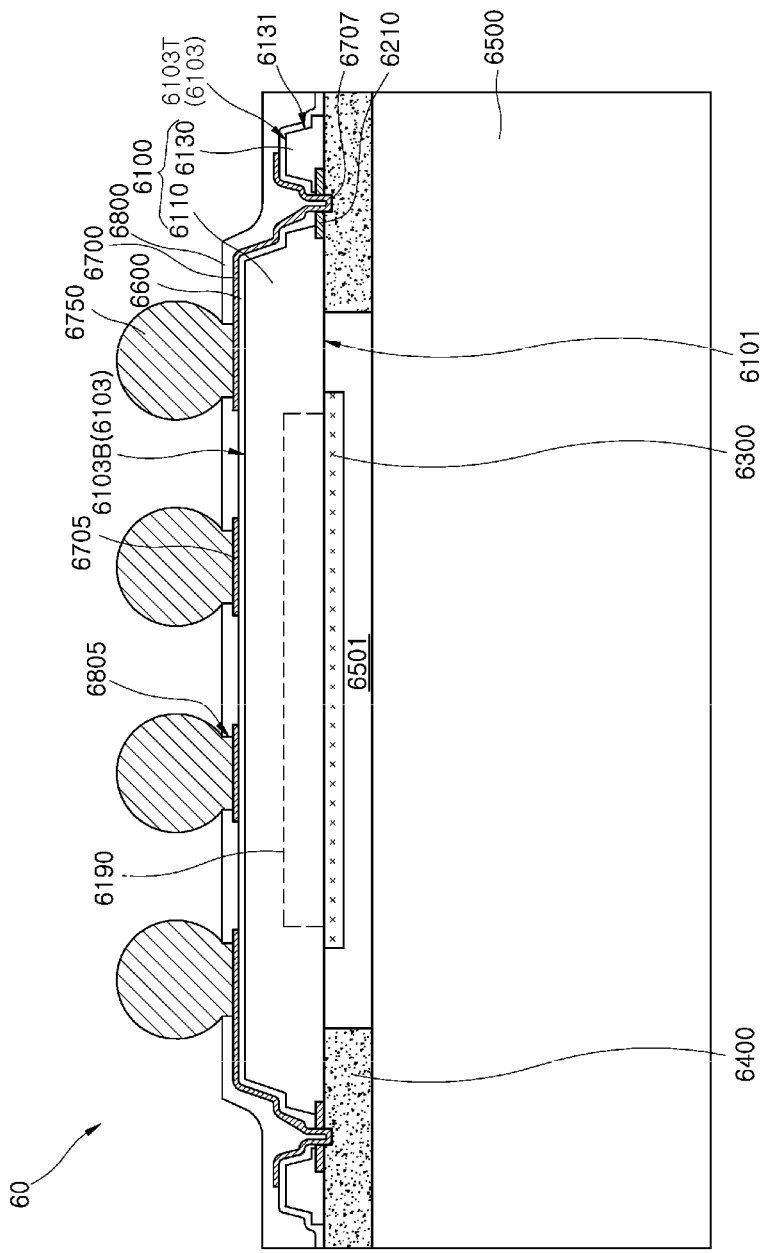
FIGS. 6 and 7 are cross-sectional views illustrating an image sensor package according to still another embodiment.
Figure 7:
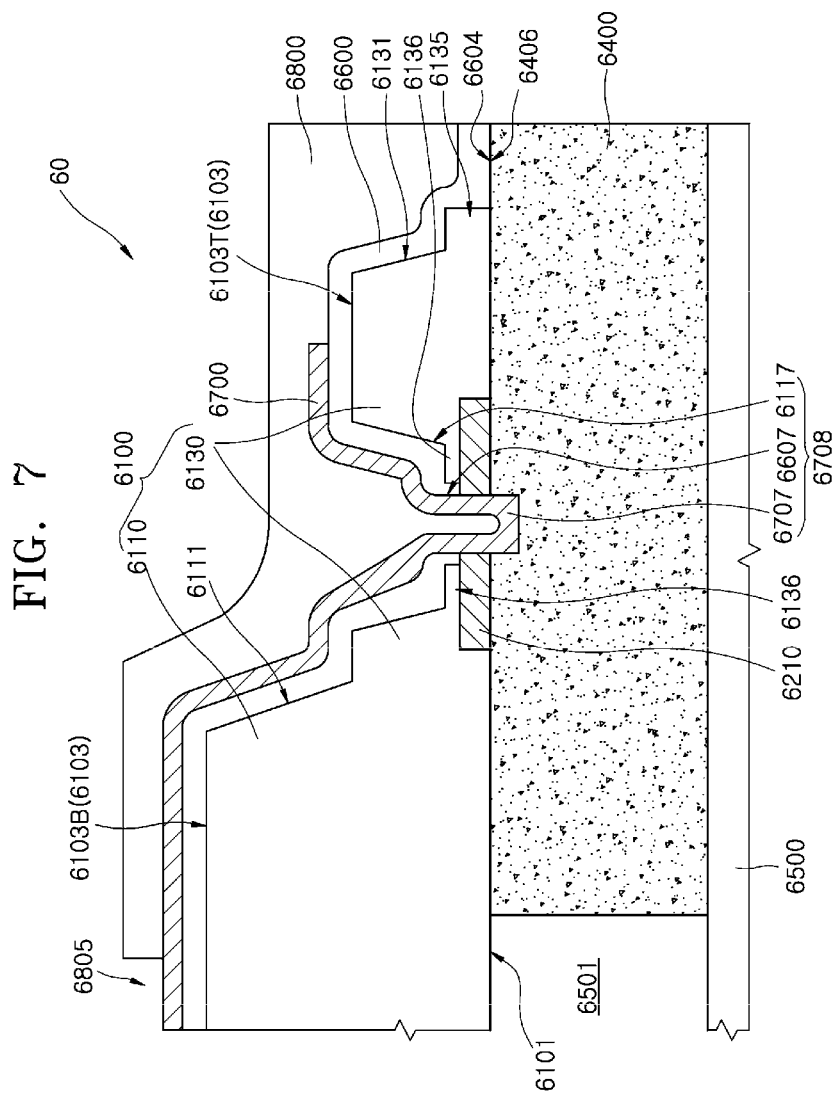

FIG. 6 is a cross-sectional view illustrating an image sensor package 60 according to still another embodiment, and FIG. 7 is a cross-sectional view illustrating an edge of the image sensor package 60 shown in FIG. 6. Referring to FIGS. 6 and 7, the image sensor package 60 may include an image sensor die 6100. The image sensor die 6100 may include a die body portion 6110, a terrace portion 6130 surrounding sidewalls of the die body portion 6110, and an outer tail portion 6135 laterally protruding from a lower portion of an outer sidewall 6131 of the terrace portion 6130. A thickness of the terrace portion 6130 may be less than a thickness of the die body portion 6110 and may be greater than a thickness of the outer tail portion 6135. Accordingly, a sloped sidewall 6111 may exist between the terrace portion 6130 and the die body portion 6110.

The image sensor die 6100 may have an active side surface 6101 and a backside surface 6103 that are opposite to each other. The image sensor die 6100 may also have an image sensor device region 6190 which is defined at a central portion of the active side surface 6101. Bonding pads 6210 may be disposed on edges of the active side surface 6101 of the image sensor die 6100. An optical lid 6500 may be disposed on the active side surface 6101 of the image sensor die 6100, and a dam-like support structure 6400 may be disposed between the image sensor die 6100 and the optical lid 6500. The dam-like support structure 6400 may cover an edge of the image sensor die 6100, for example, the active side surface 6101 of the terrace portion 6130 to provide a cavity 6501 between the optical lid 6500 and a central portion of the active side surface 6101 of the image sensor die 6100. The dam-like support structure 6400 may also cover the bonding pads 6210 formed on the edge of the image sensor die 6100.

The image sensor package 60 may include through via structures 6708. Each of the through via structures 6708 may include a conductive through via 6707, a first via hole 6117 and a second via hole 6607. The conductive through via 6707 may be electrically connected to the bonding pad 6210 and may be physically connected to a redistribution line 6700.

An inner tail portion 6136 may be disposed in the first via hole 6117. The inner tail portion 6136 may laterally protrude from a lower portion of a sidewall of the first via hole 6117. Edges of the image sensor die 6100 may have a multi-stepped profile because of the presence of the outer tail portion 6135.

The outer tail portion 6135 may laterally extend from the outer sidewall of the terrace portion 6130. Thus, the outer tail portion 6135 may affect a slope of the outer sidewall 6131 of the terrace portion 6130. That is, a slope of the outer sidewall 6131 may decrease because of the presence of the outer tail portion 6135. Accordingly, step coverage of first and second dielectric layers 6600 and 6800 covering the terrace portion 6130 may be improved by the outer tail portion 6135.

As illustrated in FIGS. 6 and 7, the first and second dielectric layers 6600 and 6800 may cover the outer tail portion 6135 and may extend to contact a surface of the dam-like support structure 6400. A double-layered structure of the first and second dielectric layers 6600 and 6800 may cover a backside surface 6103B of the die body portion 6110, a backside surface 6103T of the terrace portion 6130, the outer sidewall 6131 of the terrace portion 6130, and the outer tail portion 6135 to isolate the image sensor die 6100 from an external environment. A surface 6406 of the dam-like support structure 6400 and a surface 6604 of the first dielectric layer 6600 may directly contact in an beyond the outer edge of the image sensor die 6100. The terrace portion 6130 and the outer tail portion 6135 may be isolated from the external environment by the double-layered structure of the first and second dielectric layers 6600 and 6800. Since the terrace portion 6130 and the outer tail portion 6135 of the image sensor die 6100 are isolated from the external environment by the double-layered structure of the first and second dielectric layers 6600 and 6800, the double-layered structure of the first and second dielectric layers 6600 and 6800 may prevent cracks from forming in a silicon material of the terrace portion 6130 and the outer tail portion 6135.

In some embodiments, the terrace portion 6130 and the outer tail portion 6135 of the image sensor die 6100 may be covered and protected by only one of the first and second dielectric layers 6600 and 6800. For example, only a portion of the first dielectric layer 6600 may cover the outer sidewall 6131 of the terrace portion 6130 and a surface of the outer tail portion 6135 and may extend to contact the surface 6406 of the dam-like support structure 6400, and the second dielectric layer 6800 may not extend onto the first dielectric layer 6600. Alternatively, the second dielectric layer 6800 may extend to directly contact the surface 6406 of the dam-like support structure 6400. In such a case, the second dielectric layer 6800 may cover the outer sidewall 6131 of the terrace portion 6130 and a surface of the outer tail portion 6135, and the first dielectric layer 6600 may not extend into interfaces between the second dielectric layer 6800 and the terrace portion 6130 as well as between the second dielectric layer 6800 and the outer tail portion 6135. Accordingly, cracks in a silicon material of the terrace portion 6130 and the outer tail portion 6135 may be suppressed by at least one of the first and second dielectric layers 6600 and 6800. The second dielectric layer 6800 may have a solder mask shape including openings 6805 that expose solder pads 6705 of the redistribution lines 6700.

Each of the redistribution lines 6700 may be disposed on the first dielectric layer 6600 and may be electrically connected to one of the conductive through vias 6707. The redistribution lines 6700 may extend onto the backside surface 6103 of the image sensor die 6100. Each of the redistribution lines 6700 may include the solder pad 6705 on which an external connection member such as a solder ball 6750 is disposed. Accordingly, the redistribution lines 6700 may act as interconnection lines that electrically connect the solder balls 6750 to the conductive through vias 6707. A color filter array 6300 may be disposed in the cavity 6501 to cover the image sensor device region 6190.

Figure 8:
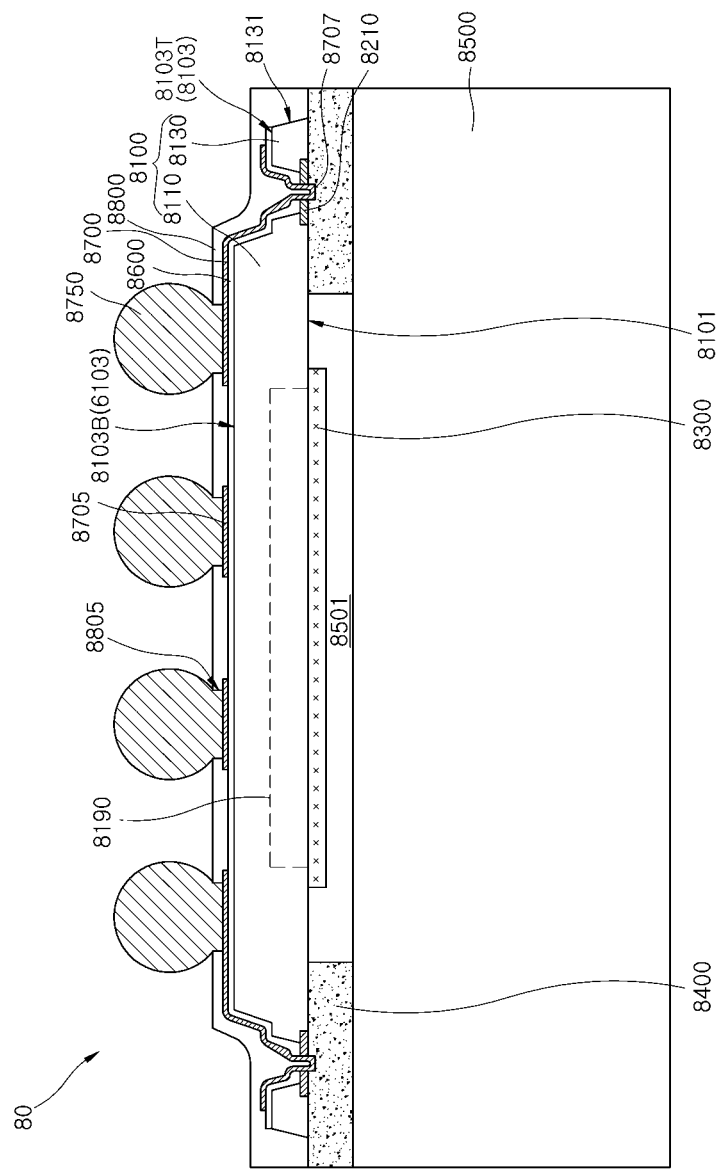
FIGS. 8 and 9 are cross-sectional views illustrating an image sensor package according to yet another embodiment.
Figure 9:
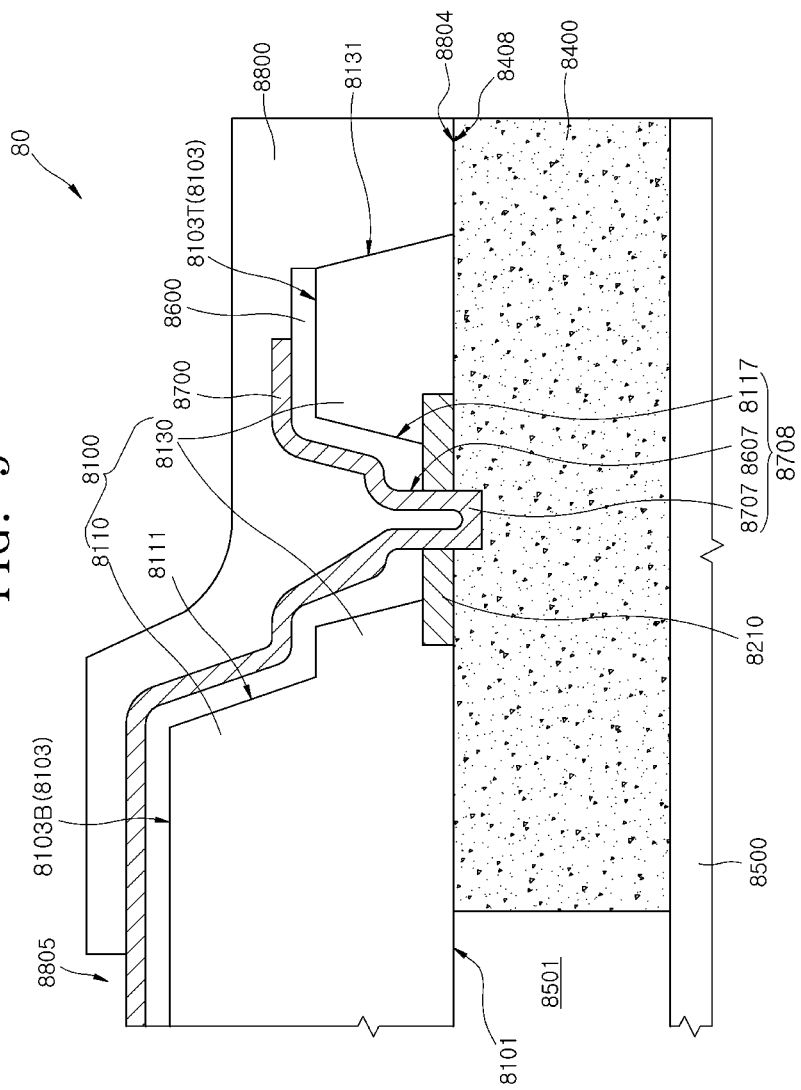

FIG. 8 is a cross-sectional view illustrating an image sensor package 80 according to yet another embodiment, and FIG. 9 is a cross-sectional view illustrating an edge of the image sensor package 80 shown in FIG. 8. Referring to FIGS. 8 and 9, the image sensor package 80 may include an image sensor die 8100. The image sensor die 8100 may include a die body portion 8110 and a terrace portion 8130 surrounding sidewalls of the die body portion 8110. A thickness of the terrace portion 8130 may be less than a thickness of the die body portion 8110. Accordingly, a sloped sidewall 8111 may exist between the terrace portion 8130 and the die body portion 8110.

The image sensor die 8100 may have an active side surface 8101 and a backside surface 8103 that are opposite to each other. The image sensor die 8100 may also have an image sensor device region 8190 which is defined at a central portion of the active side surface 8101. Bonding pads 8210 may be disposed on edges of the active side surface 8101 of the image sensor die 8100. An optical lid 8500 may be disposed on the active side surface 8101 of the image sensor die 8100, and a dam-like support structure 8400 may be disposed between the image sensor die 8100 and the optical lid 8500. The dam-like support structure 8400 may cover an edge of the image sensor die 8100, for example, the active side surface 8101 of the terrace portion 8130 to provide a cavity 8501 between the optical lid 8500 and a central portion of the active side surface 8101 of the image sensor die 8100. The dam-like support structure 8400 may also cover the bonding pads 8210 formed on the edge of the image sensor die 8100.

The image sensor package 80 may include through via structures 8708. Each of the through via structures 8708 may include a conductive through via 8707, a first via hole 8117 and a second via hole 8607. The conductive through via 8707 may be electrically connected to the bonding pad 8210 and may be physically connected to a redistribution line 8700. Each of the redistribution lines 8700 may be disposed on a first dielectric layer 8600 covering the backside surface 8103 of the image sensor die 8100 and may be electrically connected to one of the conductive through vias 8707. The redistribution lines 8700 may extend onto the backside surface 8103 of the image sensor die 8100. Each of the redistribution lines 8700 may include a solder pad 8705 on which an external connection member such a solder ball 8750 is disposed. Accordingly, the redistribution lines 8700 may act as interconnection lines that electrically connect the solder balls 8750 to the conductive through vias 8707. The first dielectric layer 8600 and the redistribution lines 8700 may be covered with a second dielectric layer 8800. The second dielectric layer 8800 may have a solder mask shape including openings 8805 that expose the solder pads 8705 of the redistribution lines 8700.

The first dielectric layer 8600 may cover sidewalls of the first via holes 8117 and a surface of the terrace portion 8130 to electrically insulate the conductive through vias 8707 and the redistribution lines 8700 from the terrace portion 8130. The first dielectric layer 8600 may be shaped so that it does not cover an outer sidewall 8131 of the terrace portion 8130. That is, an edge of first dielectric layer 8600 may be aligned with an edge of the backside surface 8103T of the terrace portion 8130 so that first dielectric layer 8600 does not extend over the outer sidewall of the terrace portion 8130. The second dielectric layer 8800 may also extend past an outer edge of the image sensor die 8100 so that a surface 8804 of the second dielectric layer 8800 directly contacts a surface 8408 of the dam-like support structure 8400. A color filter array 8300 may be disposed in the cavity 8501 to cover the image sensor device region 8190.

The surface 8804 of the second dielectric layer 8800 and the surface 8408 of the dam-like support structure 8400 may directly contact each other past an outer edge of the image sensor die 8100 to seal the terrace portion 8130 of the image sensor die 8100. Since the outer sidewall 8131 of the terrace portion 8130 of the image sensor die 8100 is isolated from the external environment by the second dielectric layer 8800, the second dielectric layer 8800 may prevent cracks from forming in a silicon material of the terrace portion 8130 even though the external environment varies.

Figure 10:
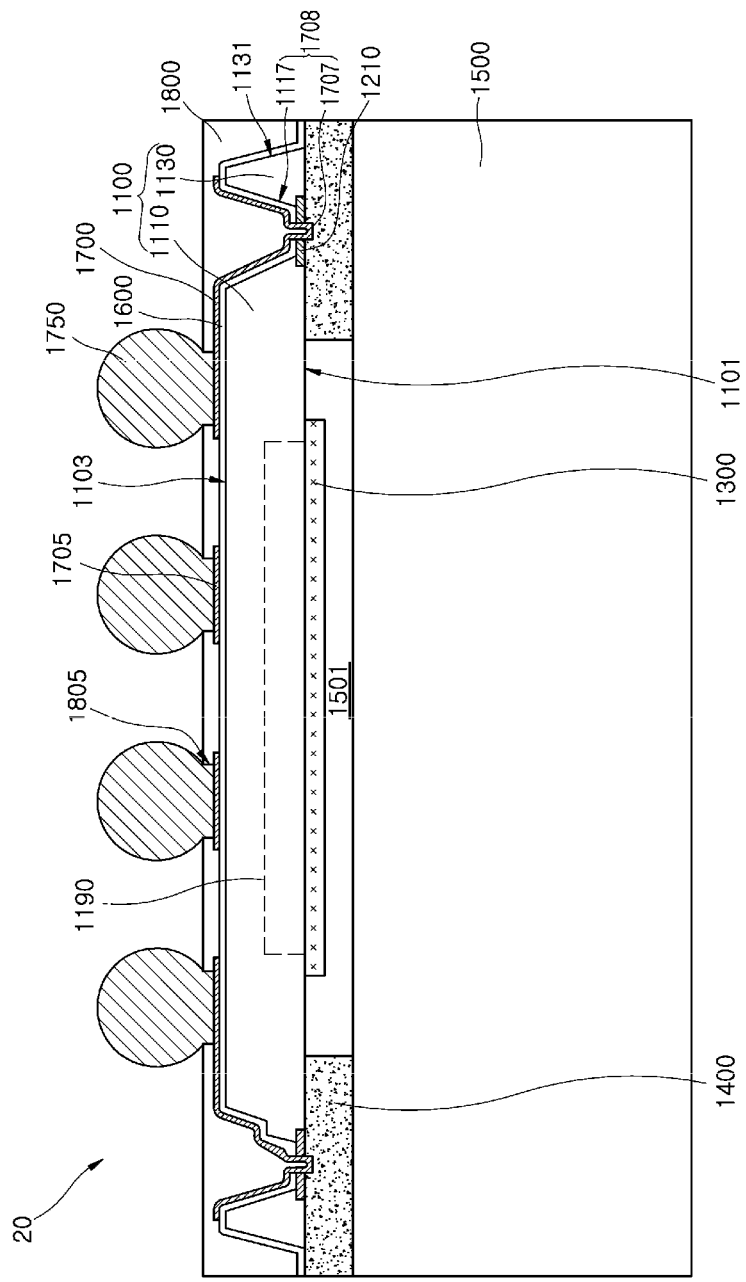
FIG. 10 is a cross-sectional view illustrating an image sensor package according to yet still another embodiment.

FIG. 10 is a cross-sectional view illustrating an image sensor package 20 according to still another embodiment.

Referring to FIG. 10, the image sensor package 20 may include an image sensor die 1100. The image sensor die 1100 may correspond to a semiconductor substrate in which a device converting optical images into electrical signals is integrated or a semiconductor chip in which a CMOS image sensor circuit is integrated. The image sensor package 20 may have substantially the same size as the image sensor die 1100 or a similar size to the image sensor die 1100. That is, the image sensor package 20 may be formed using a chip scale package technique.

The image sensor die 1100 may have an active side surface 1101 and a backside surface 1103 that are opposite to each other. The image sensor die 1100 may also have outer sidewalls 1131 between the active side surface 1101 and the backside surface 1103. The image sensor die 1100 may have an image sensor device region 1190 which is defined at a central portion of the active side surface 1101. Bonding pads 1210 may be disposed on edges of the active side surface 1101 of the image sensor die 1100.

The image sensor device region 1190 may correspond to an image sensing region in which a photoelectric conversion device, for example, a CMOS image sensor device is integrated. Peripheral circuits (not shown) for driving the photoelectric conversion device may be disposed on a portion of the active side surface 1101 adjacent to the image sensor device region 1190. In addition, internal interconnection lines (not shown) electrically connected to the photoelectric conversion device or the peripheral circuits may be disposed on the edges of the active side surface 1101. The internal interconnection lines may have a multi-layered metal interconnection structure. The bonding pads 1210 may also be disposed on edges of the active side surface 1101 to electrically connect the internal interconnection lines to external devices or external circuits.

The image sensor die 1100 may include a die body portion 1110 and an edge portion 1130 surrounding sidewalls of the die body portion 1110. The image sensor device region 1190 may be disposed in the die body portion 1110, and the bonding pads 1210 may be disposed on the active side surface 1101 of the edge portion 1130. The die body portion 1110 and the edge portion 1130 may have substantially the same thickness.

As illustrated in FIG. 10, an optical lid 1500 may be disposed on the active side surface 1101 of the image sensor die 1100. The optical lid 1500 may include a transparent material, for example, an optical grade glass material or a quartz material. A dam-like support structure 1400 may be disposed between the image sensor die 1100 and the optical lid 1500.

The dam-like support structure 1400 may cover an edge of the image sensor die 1100, for example, the active side surface 1101 of the edge portion 1130 and may laterally extend toward an outer edge of the image sensor die 1100. The dam-like support structure 1400 may laterally extend past an outer edge of the image sensor die 1100 so that a top surface of the dam-like support structure 1400 directly contacts a lower portion of the outer sidewalls 1131 of the image sensor die 1100. The dam-like support structure 1400 may cover portions of the image sensor die 1100 and the bonding pads 1210 on the edges of the active side surface 1101. Accordingly, a cavity 1501 may be provided between the optical lid 1500 and a central portion of the active side surface 1101 of the image sensor die 1100. A depth of the cavity 1501 may be defined by a thickness of the support structure 1400.

The dam-like support structure 1400 may include an epoxy resin material, a polyimide material, a photoresist material or a solder resist material. The dam-like support structure 1400 may be attached to the image sensor die 1100 using an adhesive agent (not shown). The optical lid 1500 may also be attached to the dam-like support structure 1400 using an adhesive agent (not shown). Accordingly, the active side surface 1101 of the image sensor die 1100 may be completely covered with the optical lid 1500 and the dam-like support structure 1400 so it is isolated from an external environment.

The image sensor device region 1190 may be exposed to the cavity 1501 which is provided by the dam-like support structure 1400. External light passing through the optical lid 1500 may be irradiated onto the image sensor device disposed in the image sensor device region 1190, and the image sensor device may receive the external light to generate electrical signals corresponding to image data. A color filter array 1300 may be disposed in the cavity 1501 to cover the image sensor device region 1190. Although not shown in the drawings, an optical member such as a micro lens array may be additionally disposed on the color filter array 1300.

The image sensor package 20 may include through via structures 1708 such as through silicon vias (TSVs). Each of the through via structures 1708 may include a conductive through via 1707 penetrating the edge portion 1130 of the image sensor die 1100. The conductive through via 1707 may pass through the edge portion 1130 of the image sensor die 1100 and may be electrically connected to one of the bonding pads 1210.

The backside surface 1103 of the image sensor die 1100 may be covered with a first dielectric layer 1600. The first dielectric layer 1600 may extend between the conductive through via 1707 and the edge portion 1130 of the image sensor die 1100. The first dielectric layer 1600 may electrically isolate or insulate the conductive through via 1707 from the edge portion 1130 of the image sensor die 1100. The first dielectric layer 1600 may cover the backside surface 1103 of the image sensor die 1100 to act as a passivation layer that substantially covers the image sensor die 1100. The first dielectric layer 1600 may include an insulation layer containing silicon elements, for example, a silicon oxide material or a silicon nitride material. However, the first dielectric layer 1600 is not limited to being a silicon oxide material or the silicon nitride material. In some embodiments, the first dielectric layer 1600 is an organic polymer material.

The conductive through via 1707 may be electrically insulated from the die body portion 1110 and the edge portion 1130 by the first dielectric layer 1600. The conductive through via 1707 may be disposed in a first via hole 1117 that penetrates the edge portion 1130. The first via hole 1117 may correspond to a through hole that exposes a portion of a backside surface of the bonding pad 1210 opposite to the dam-like support structure 1400.

The first dielectric layer 1600 may cover a sidewall of the first via hole 1117 and a portion of the backside surface of the bonding pad 1210. The first dielectric layer 1600 covering the backside surface 1103 of the die body portion 1110 may extend over a sidewall of the first via hole 1117 and the backside surface 1103 of the edge portion 1130 to electrically isolate the conductive through via 1707 from the edge portion 1130.

The conductive through via 1707 may penetrate the first dielectric layer 1600. The conductive through via 1707 may penetrate the bonding pad 1210. The conductive through via 1707 may vertically pass through the bonding pad 1210 and contact a surface of the dam-like support structure 1400 or to extend into the dam-like support structure 1400. Thus, the bonding pad 1210 may be connected to an outer sidewall of the conductive through via 1707. Accordingly, a joint portion of the conductive through via 1707 and the bonding pad 1210 may have a "T"-shaped cross-sectional view. In order for a lower portion of the conductive through via 1707 to penetrate the bonding pad 1210 or extend into the dam-like support structure 1400, a second via hole in which the conductive through via 1707 is disposed may penetrate the first dielectric layer 1600 and the bonding pad 1210. Accordingly, the conductive through via 1707 disposed in the second via hole may penetrate the first dielectric layer 1600, and a portion of the conductive through via 1707 may be buried in the dam-like support structure 1400. Thus, the through via structure 1708 including the conductive through via 1707 and the first via hole 1117 may provide a reliable connection structure between the bonding pad 1210 and the conductive through via 1707.

The image sensor package 20 may further include redistribution lines 1700 that are disposed on the first dielectric layer 1600 and are electrically connected to the conductive through vias 1707. The redistribution lines 1700 may extend onto the backside surface 1103 of the image sensor die 1100. Each of the redistribution lines 1700 may include a solder pad 1705 on which an external connection member such a solder ball 1750 is disposed. Accordingly, the redistribution lines 1700 may act as interconnection lines that electrically connect the solder balls 1750 to the conductive through vias 1707. The redistribution lines 1700 may include the same conductive material as the conductive through vias 1707. Each of the redistribution lines 1700 may extend from one of the conductive through vias 1707 to cover a portion of the edge portion 1130.

Each of the redistribution lines 1700 may have a circuit trace pattern shape and include a copper material or an aluminum material. Each of the solder pads 705 may further include a metal material that is suitable for soldering. For example, each of the solder pads 1705 may include a copper layer, an aluminum layer, a nickel layer, a gold layer, or a combination thereof. The nickel layer included in each solder pad 1705 may act as a wetting layer for soldering, and the gold layer included in each solder pad 1705 may act as an oxidation barrier layer.

The image sensor package 20 may further include a second dielectric layer 1800 that is disposed on the backside surface 1103 of the image sensor die 1100 and cover the first dielectric layer 1600 and the redistribution lines 1700. The second dielectric layer 1800 may encapsulate the image sensor die 1100. The second dielectric layer 1800 may have a solder mask shape that covers portions of the redistribution lines 1700 except for the solder pads 1705. That is, the second dielectric layer 1800 may have openings 1805 that expose the solder pads 1705. The second dielectric layer 1800 may include an organic polymer layer containing a solder resist material. The second dielectric layer 1800 may protect the image sensor die 1100 together with the first dielectric layer 1600.

The first and second dielectric layers 1600 and 1800 may cover the backside surface 1103 and the outer sidewalls 1131 of the image sensor die 1100 and may extend onto a surface of the dam-like support structure 1400 past an edge of the image sensor die 1100. A surface of the dam-like support structure 1400 and a surface of the first dielectric layer 1600 may be in direct contact with each beyond the outer edge of the image sensor die 1100. A double-layered structure of the first and second dielectric layers 1600 and 1800 may isolate the image sensor die 1100 from an external environment. Since the edge portion 1130 of the image sensor die 1100 is isolated from an external environment by the double-layered structure of the first and second dielectric layers 1600 and 1800, the double-layered structure of the first and second dielectric layers 1600 and 1800 may prevent cracks from forming in a silicon material of the edge portion 1130 even though the external environment varies.

A thermal expansion coefficient of the edge portion 1130 may be different from a thermal expansion coefficient of the dam-like support structure 1400. Thus, if the external environment varies, a stress may be concentrated at interfaces between the edge portion 1130 and the dam-like support structure 1400. However, the edge portion 1130 of the image sensor die 1100 may be sealed with the double-layered structure of the first and second dielectric layers 1600 and 1800. Thus, the stress generated at interfaces between the edge portion 1130 and the dam-like support structure 1400 may be alleviated or absorbed by the double-layered structure of the first and second dielectric layers 1600 and 1800. As a result, the double-layered structure of the first and second dielectric layers 1600 and 1800 may prevent cracks from forming in a silicon material of the edge portion 1130. In contrast, if a portion of the edge portion 1130 is not sealed and is exposed to the external environment, a stress may be concentrated between the exposed portion of the edge portion 1130 and the dam-like support structure 1400. In such a case, cracks may be initiated from the end of the edge portion 1130 and may be spread into the image sensor die 100 due to the stress.

In some embodiments, the first dielectric layer 1600 may not to cover an outer sidewall 1131 of the edge portion 1130. That is, the first dielectric layer 1600 may terminate at the edge of backside surface 1103T, and the second dielectric layer 1800 may extend to directly contact the outer sidewall 1131 of the edge portion 1130. The second dielectric layer 1800 may also extend beyond outer edge of the image sensor die 1100 so that a surface of the second dielectric layer 1800 directly contacts a surface of the dam-like support structure 1400. The surface of the second dielectric layer 1800 and the surface of the dam-like support structure 1400 may directly contact each to seal the edge portion 1130 of the image sensor die 1100. Since the outer sidewall 1131 of the edge portion 1130 of the image sensor die 1100 is isolated from the external environment by the second dielectric layer 1800, the second dielectric layer 1800 may prevent cracks from forming in a silicon material of the edge portion 1130 even though the external environment varies.

Although various image sensor packages 10, 20, 40, 60 and 80 according to some embodiments are described with reference to FIGS. 1 to 10, the present disclosure may also be applied to other semiconductor packages having a dielectric layer that covers sidewalls of a semiconductor substrate or a semiconductor die. If the sidewalls of the semiconductor substrate or the semiconductor die are covered with the dielectric layer, the dielectric layer may prevent a silicon material of the semiconductor substrate or the semiconductor die from being exposed to an external environment.

FIGS. 11 to 26 are schematic views illustrating a method of fabricating an image sensor package according to an embodiment.

Figure 11:
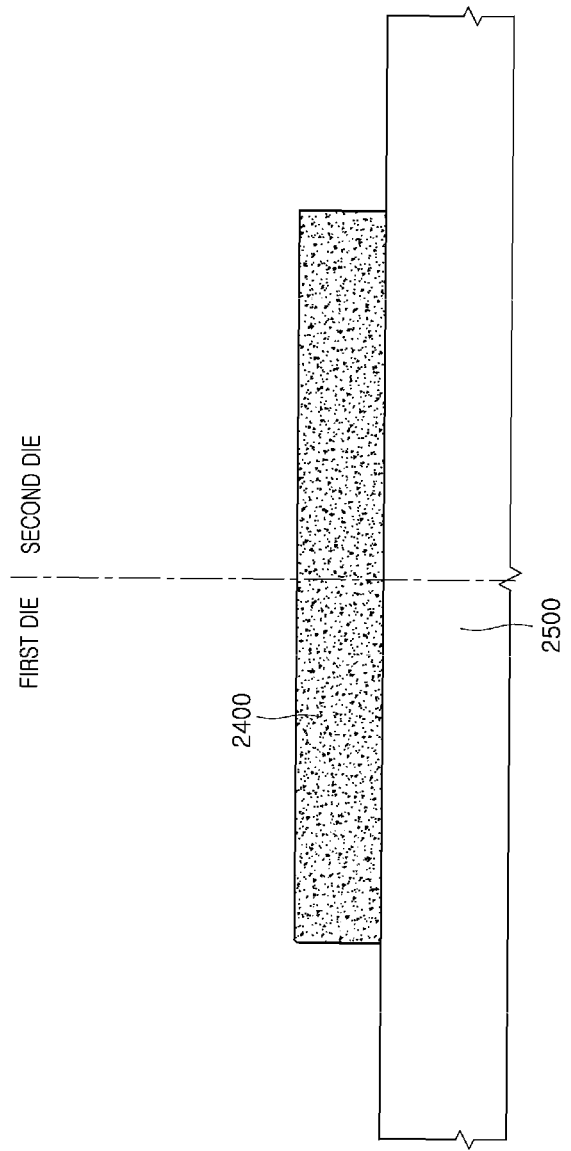
FIGS. 11 to 26 are schematic views illustrating a method of fabricating an image sensor package according to an embodiment.
Figure 12:
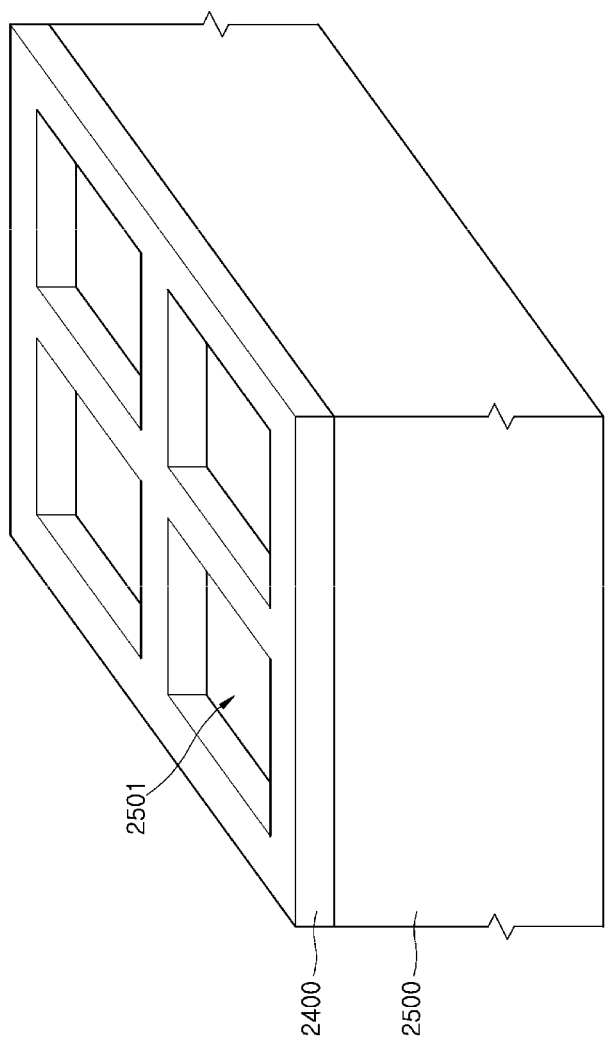

FIGS. 11 and 12 illustrate forming a support structure 2400 on an optical lid 2500.

Referring to FIGS. 11 and 12, the support structure 2400 may be formed on an optical glass member which is used as the optical lid 2500. The support structure 2400 may have a grid shape to provide cavities 2501 therein. The optical glass member 2500, that is, the optical lid, may have a sufficient planar area to accommodate a plurality of dies, for example, a first image sensor die and a second image sensor die. The plurality of dies may be aligned with the cavities 2501 of the optical lid 2500, respectively. The support structure 2400 may be formed to include an epoxy resin material, a polyimide material, a photoresist material or a solder resist material. For example, the support structure 2400 may be formed by coating a solder resist material on the optical lid 2500 and by applying exposure and development steps to the solder resist material to form the cavities 2501.

Figure 13:
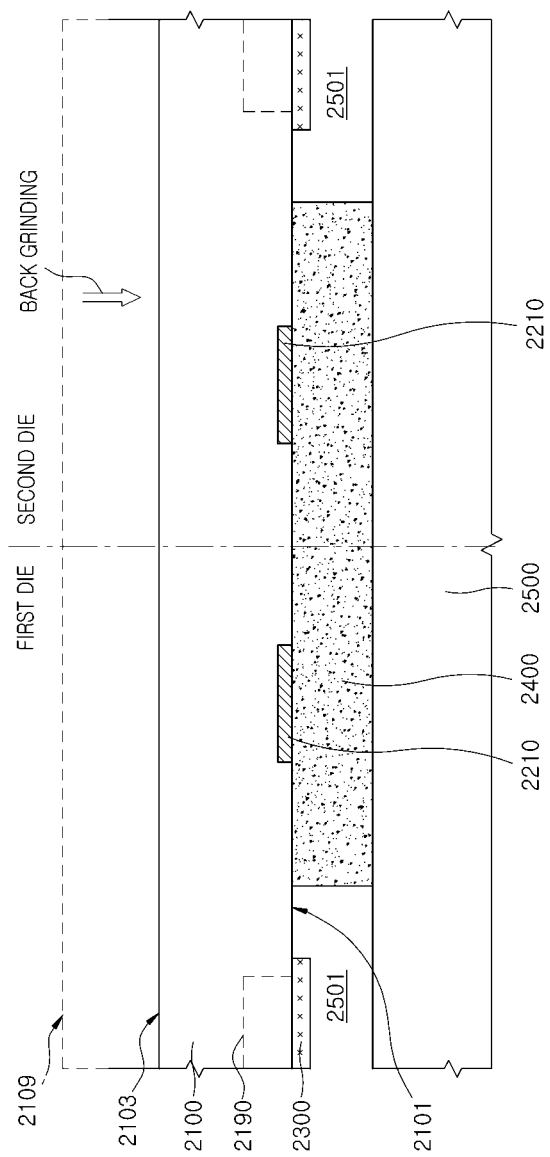

FIG. 13 illustrates a step of attaching a wafer 2100 to the optical lid 2500. Referring to FIG. 13, the wafer 2100 including a plurality of image sensor dies may be attached to the support structure 2400. Each of the plurality of image sensor dies may include a die body portion and a terrace portion (or an edge portion), as described with reference to FIG. 1. The wafer 2100 in which the plurality of image sensor dies are integrated may be provided to form an image sensor package.

The wafer 2100 may be attached to the support structure 2400 using an adhesive agent (not shown). The support structure 2400 may be in contact with the edge portions of the image sensor dies. A back-grinding process may be applied to an initial backside surface 2109 of the wafer 2100 to reduce a thickness of the wafer 2100. As a result, the ground wafer 2100 may have an active side surface 2101 and a backside surface 2103 that are opposite to each other. Each of the image sensor dies may be formed to include bonding pads 2210 disposed on the active side surface 2101 of the edge portion thereof. Each of the image sensor dies may be formed to further include an optical member such as a color filter array 2300 disposed on the active side surface 2101 of the die body portion thereof.

Figure 14:
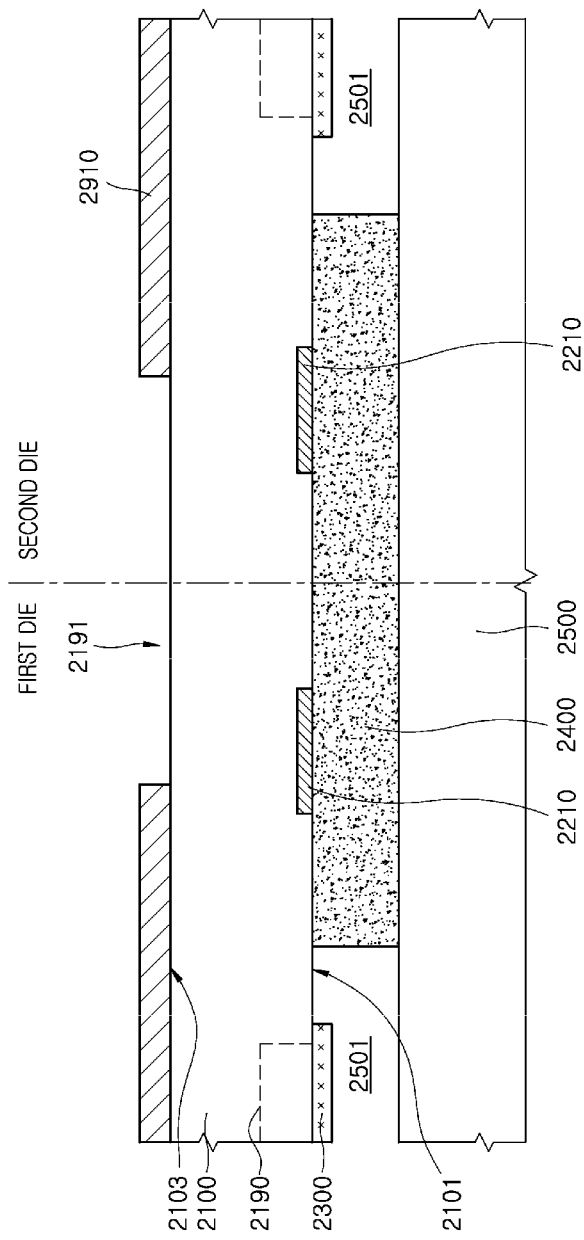

FIG. 14 illustrates a step of forming a first mask 2910 that exposes edge portions 2191 of the image sensor dies.

Referring to FIG. 14, the first mask 2910 may be formed on the backside surface 2103 of the wafer 2100 to expose the edge portions 2191 of the image sensor dies. The first mask 2910 may be formed by coating a photoresist material and by patterning the photoresist material with a photolithography process. The edge portions 2191 exposed by the first mask 2910 may correspond to the terrace portions 130 illustrated in FIG. 1. The edge portions 2191 may overlap with a scribe lane between the first and second dies.

Figure 15:
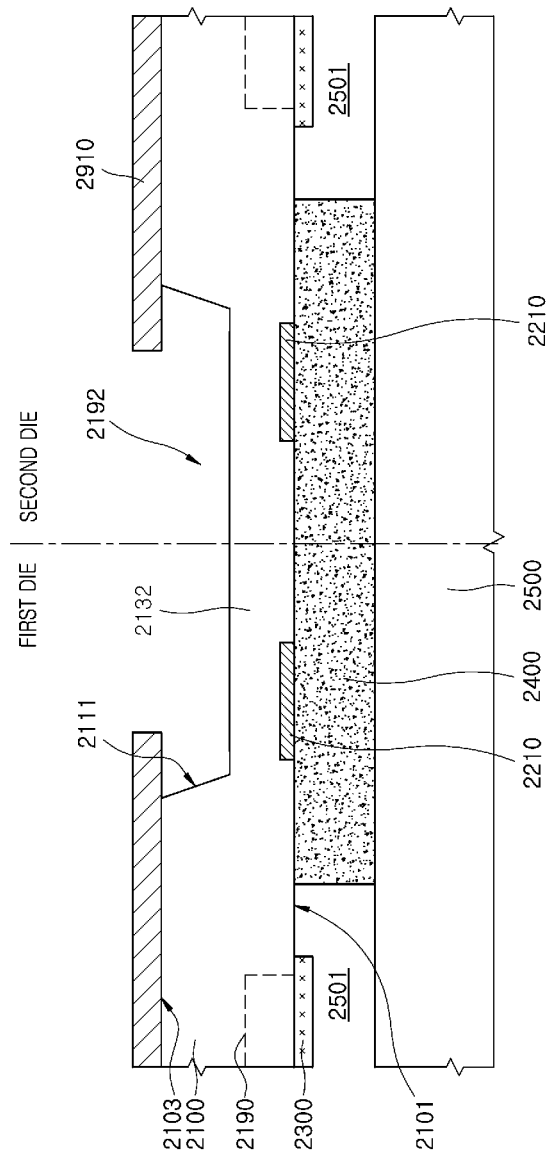

FIG. 15 illustrates a step of forming a trench 2192 in the edge portions 2191.

Figure 16:
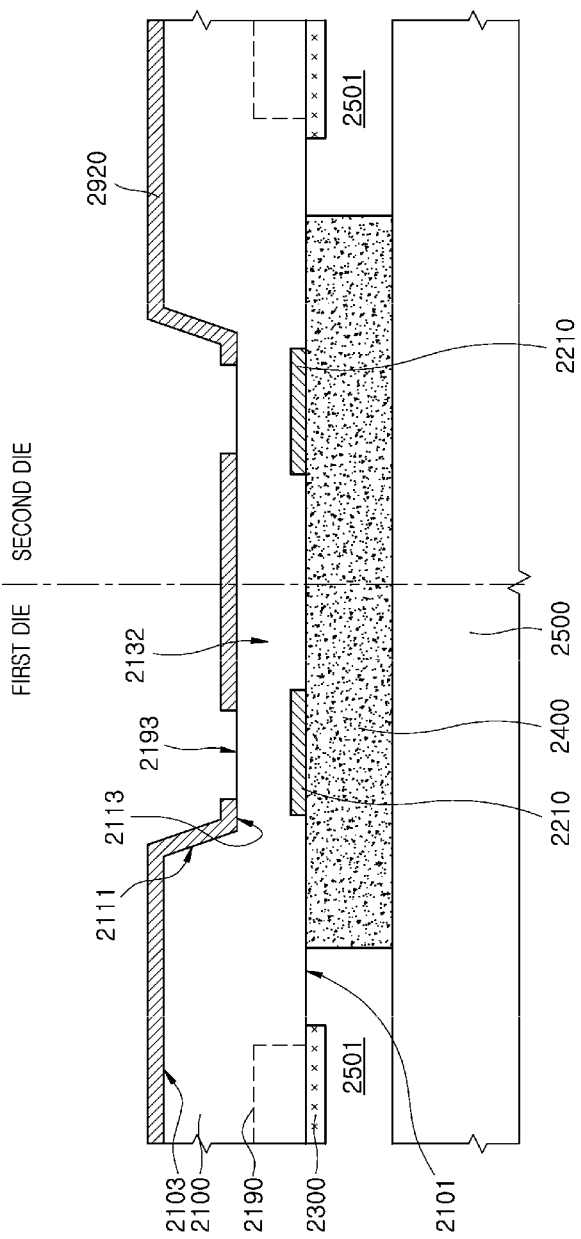

Referring to FIG. 15, the edge portions 2191 of the image sensor dies may be selectively etched using the first mask 2910 as an etch mask, thereby forming the trench 2192 having sidewalls 2111 in the edge portions 2191. The trench 2192 may be formed using a dry etch process and may be formed to have a depth that corresponds to about 0.4 times to about 0.7 times a thickness of the wafer 2100. A portion of the wafer 2100 remaining under the trench 2192 may correspond to a preliminary terrace portion 2132. That is, the preliminary terrace portion 2132 may have a thickness which is less than a thickness of the wafer 2100. FIG. 16 illustrates a step of forming a second mask 2920 that exposes portions of the preliminary terrace portion 2132.

Referring to FIG. 16, after removing the first mask 2910, a second mask 2920 may be formed on the wafer 2100 to expose first via hole regions 2193 corresponding to portions of the preliminary terrace portion 2132. The second mask 2920 may be formed so that the first via hole regions 2193 are spaced apart from the sidewalls 2111 of the trench 2192 by a region 2113.

Figure 17:
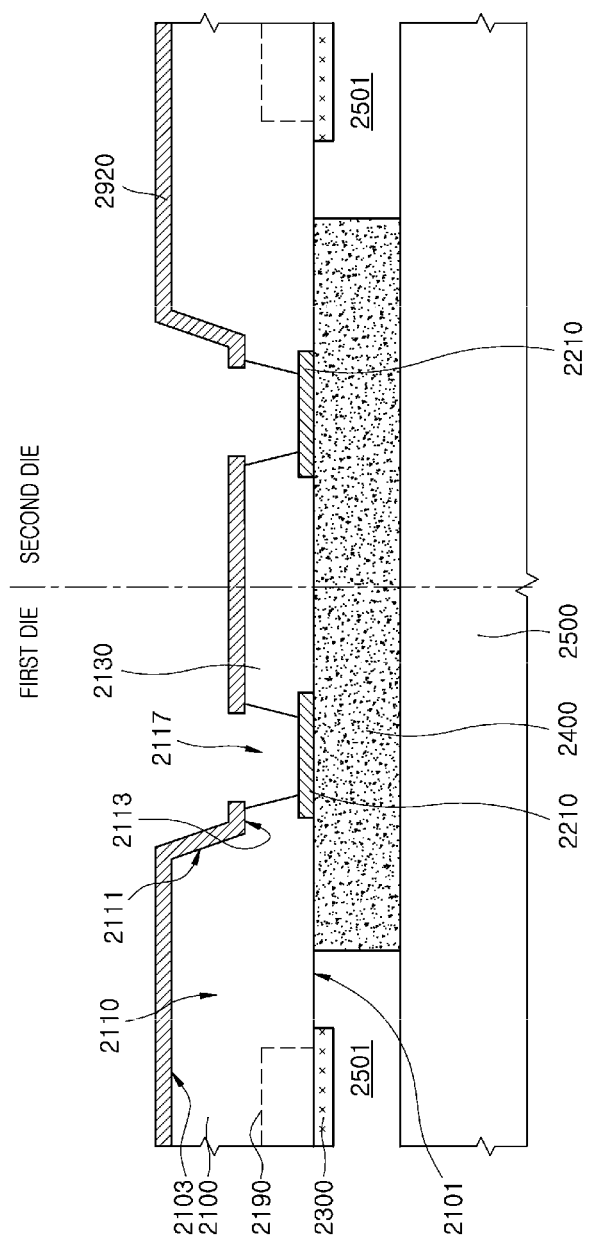

FIG. 17 illustrates a step of forming first via holes 2117.

Referring to FIG. 17, the first via hole regions 2193 exposed by the second mask 2920 may be selectively etched to form first via holes 2117 having a through hole shape. The first via holes 2117 may be formed to expose the bonding pads 2210 by removing the first via hole regions 2193 with a dry etch process. As a result, a terrace portion 2130 including the first via hole 2117 may be formed in an edge portion of each die.

Figure 18:
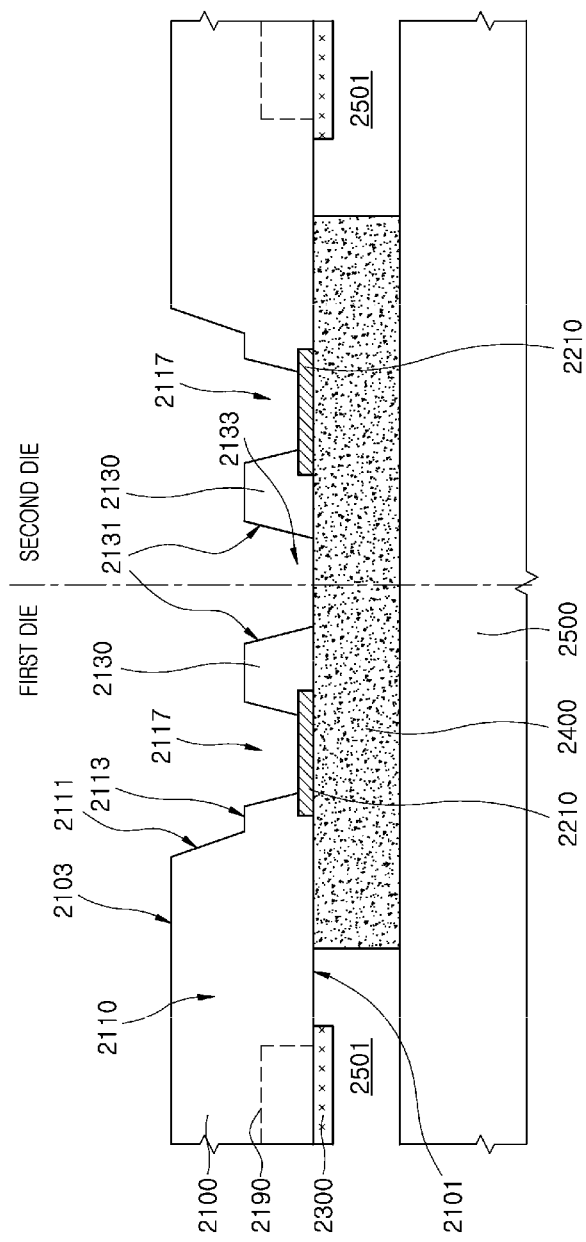
Figure 19:
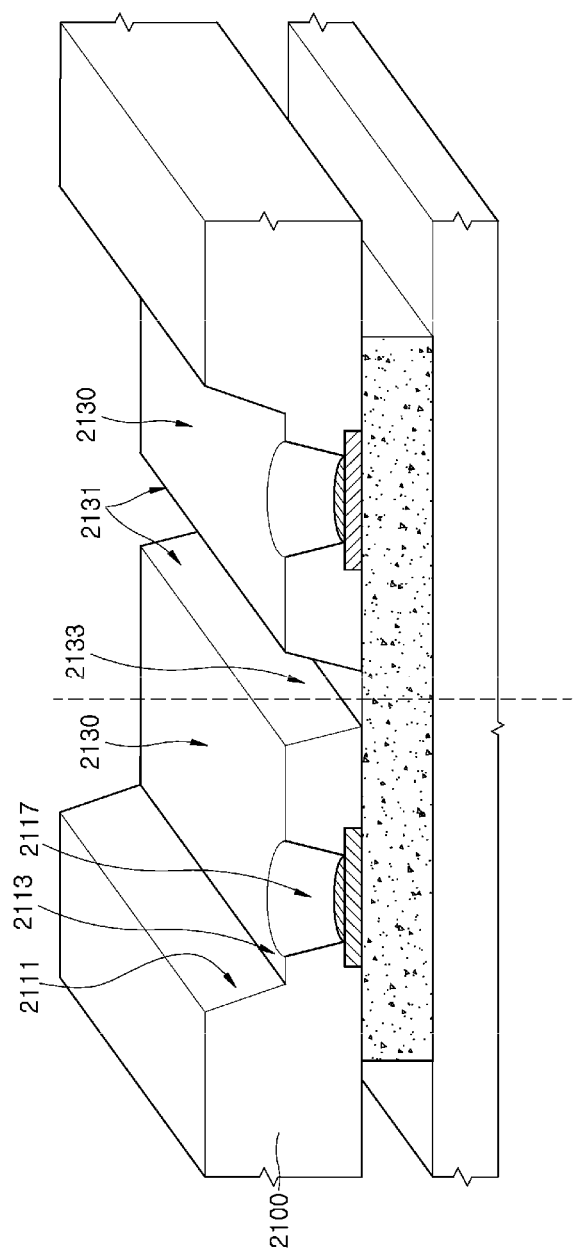

FIGS. 18 and 19 illustrate a step of removing a portion of the terrace portion 2130.

Referring to FIGS. 18 and 19, after removing the second mask 2920, a central region of the terrace portion 2130 may be selectively removed to form a second trench 2133, which may also be referred to as a half cut trench 2133. That is, the half cut trench 2133 may be formed by removing a portion of the terrace portion 2130 which is located at a border region between the first die and the second die. Sidewalls 2131 of the half cut trench 2133 may correspond to outer sidewalls of the terrace portions 2130. The half cut trench 2133 may be formed to penetrate the terrace portion 2130 and to expose the support structure 2400. Thus, the half cut trench 2133 may be formed to substantially separate the first die and the second die. The half cut trench 2133 may be formed using a dry etch process. Alternatively, the half cut trench 2133 may be formed by sawing the terrace portions 2130 with a blade (not shown). As a result, the first die and the second die may be physically separated from each other by the half cut trench 2133, and a terrace portion 2130 may be independently formed in each die.

Figure 20:
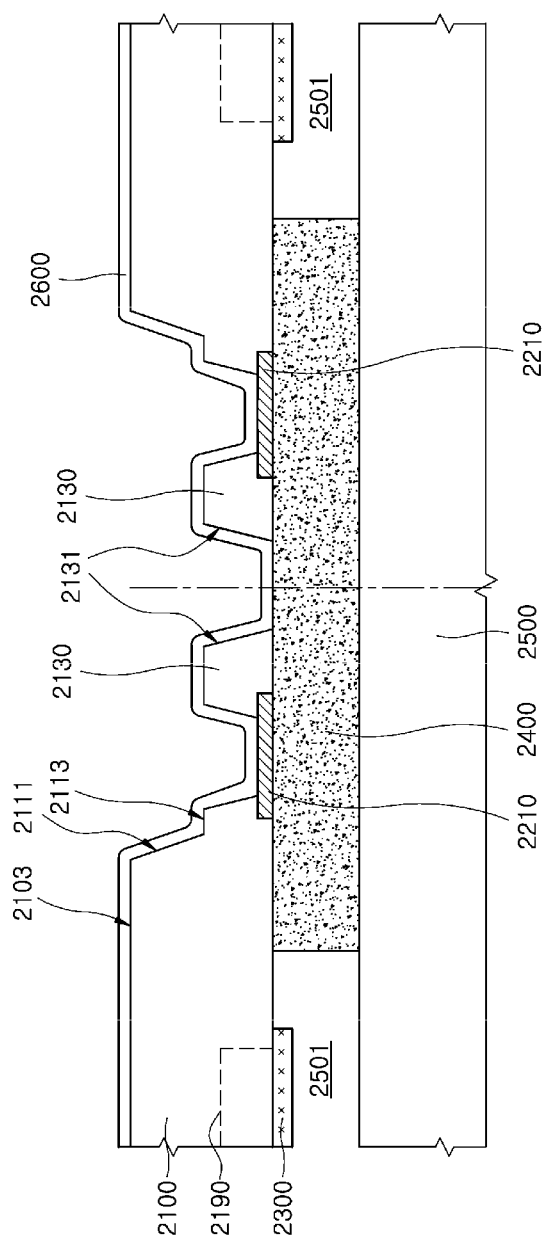

FIG. 20 illustrates a step of forming a first dielectric layer 2600 on the wafer 2100.

Referring to FIG. 20, the first dielectric layer 2600 may be formed on the backside surface 2103 of the wafer 2100. The first dielectric layer 2600 may also be formed to cover surfaces of the terrace portions 2130, sidewalls of the first via holes (2117 of FIGS. 18 and 19), and the exposed portions of the bonding pads 2210. In addition, the first dielectric layer 2600 may be formed to cover the outer sidewalls 2131 of the terrace portions 2130 and portions of the support structure 2400 exposed by the half cut trench 2133.

Figure 21:
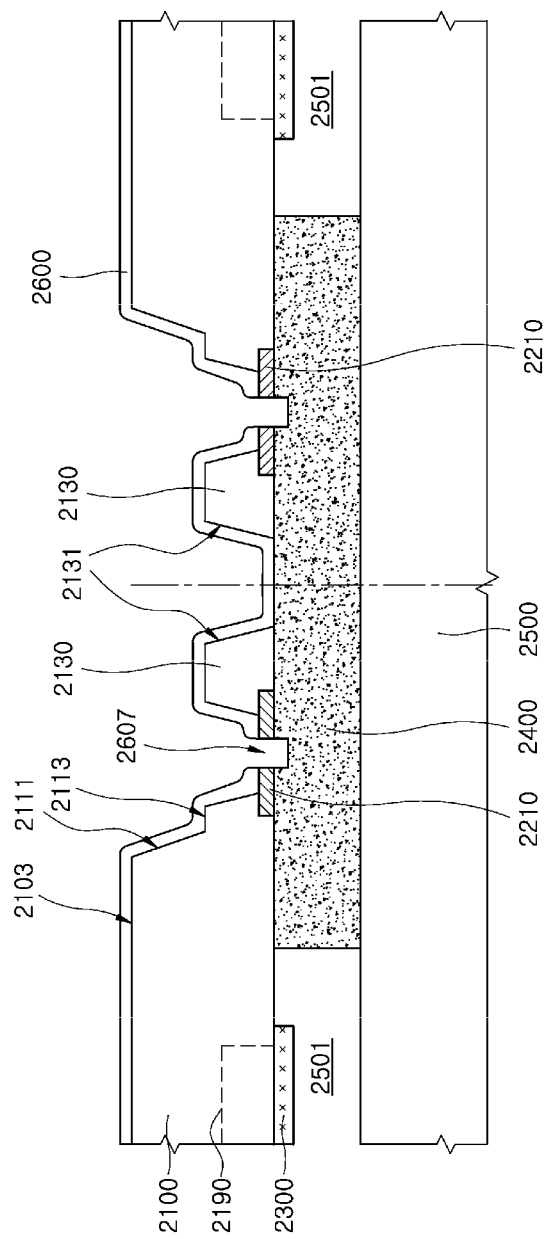

FIG. 21 illustrates a step of forming second via holes 2607 that expose the bonding pads 2210.

Referring to FIG. 21, portions of the first dielectric layer 2600 may be selectively etched to form the second via holes 2607 that expose the bonding pads 2210. The second via holes 2607 may be formed to penetrate the first dielectric layer 2600 using an etch process such as a dry etch process or a laser drilling process. The second via holes 2607 may be formed to penetrate the first dielectric layer 2600 and the bonding pads 2210 by sequentially etching the first dielectric layer 2600 and the bonding pads 2210. In some embodiments, the second via holes 2607 may be formed to penetrate the first dielectric layer 2600 and the bonding pads 2210 and to extend into the support structure 2400. In such a case, portions of the support structure 2400 may be recessed to define lower portions of the second via holes 2607.

Figure 22:
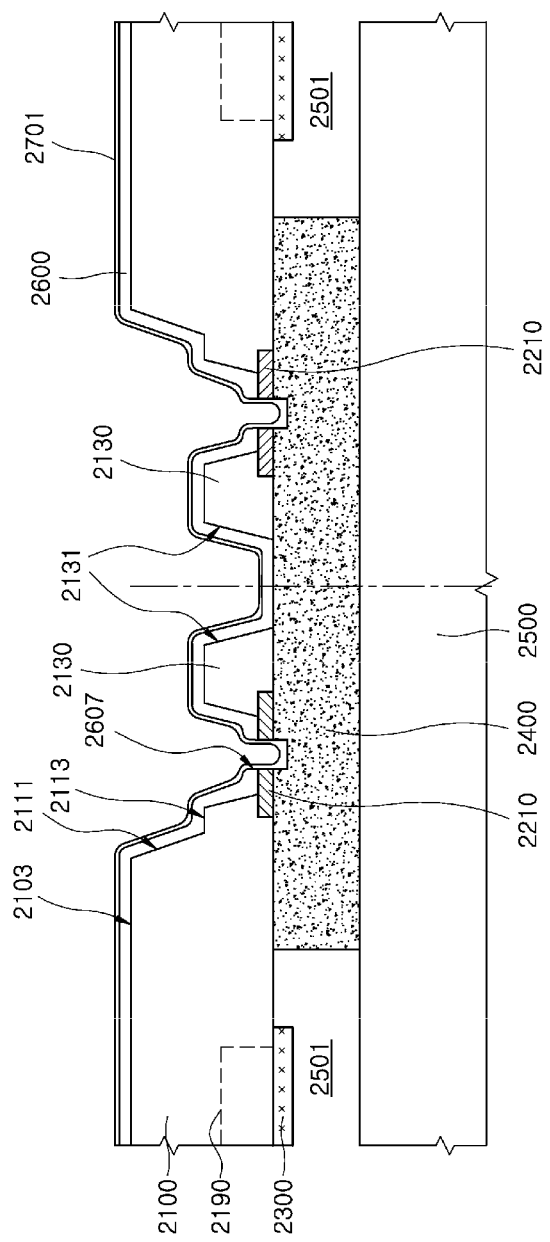

FIG. 22 illustrates a step of forming a first conductive layer 2701 connected to the bonding pads 2210.

Referring to FIG. 22, the first conductive layer 2701 may be formed on the first dielectric layer 2600 and in the second via holes 2607. For example, the first conductive layer 2701 may be an aluminum layer formed by a sputtering process. The first conductive layer 2701 may be formed to provide redistribution lines and conductive through vias. The first conductive layer 2701 may be used as a seed layer in the event that the redistribution lines and the conductive through vias are formed using an electroplating process.

Figure 23:
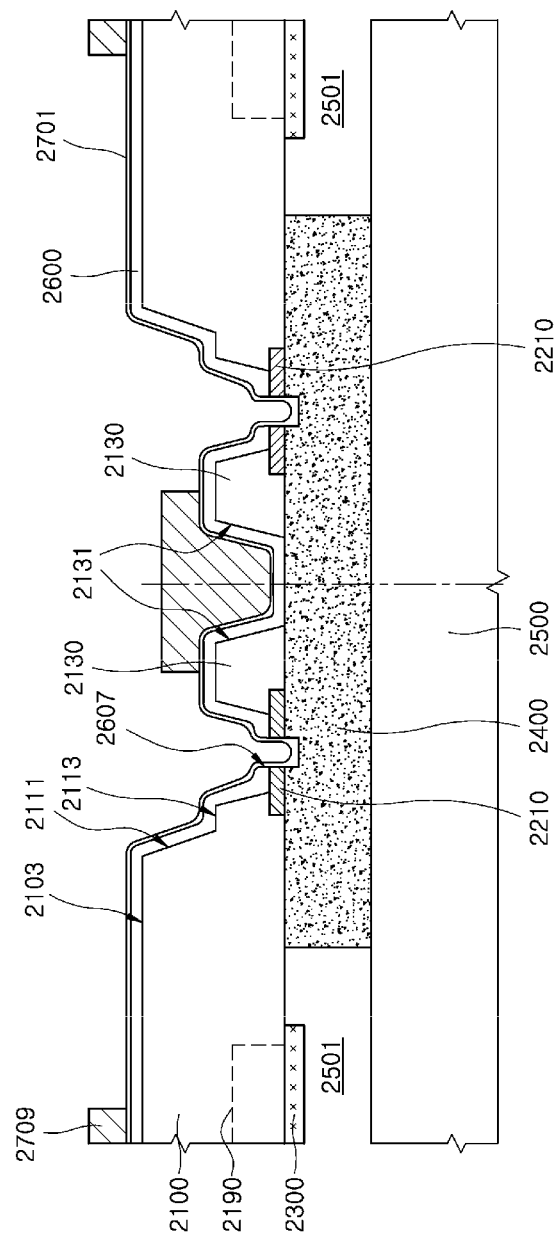

FIG. 23 illustrates a step of forming an electroplating mask 2709 on the first conductive layer 2701.

Referring to FIG. 23, the electroplating mask 2709 may be formed on the first conductive layer 2701 that is used as a seed layer during a subsequent electroplating process for forming the redistribution lines and the conductive through vias. The electroplating mask 2709 may be formed to expose portions of the first conductive layer 2701.

Figure 24:
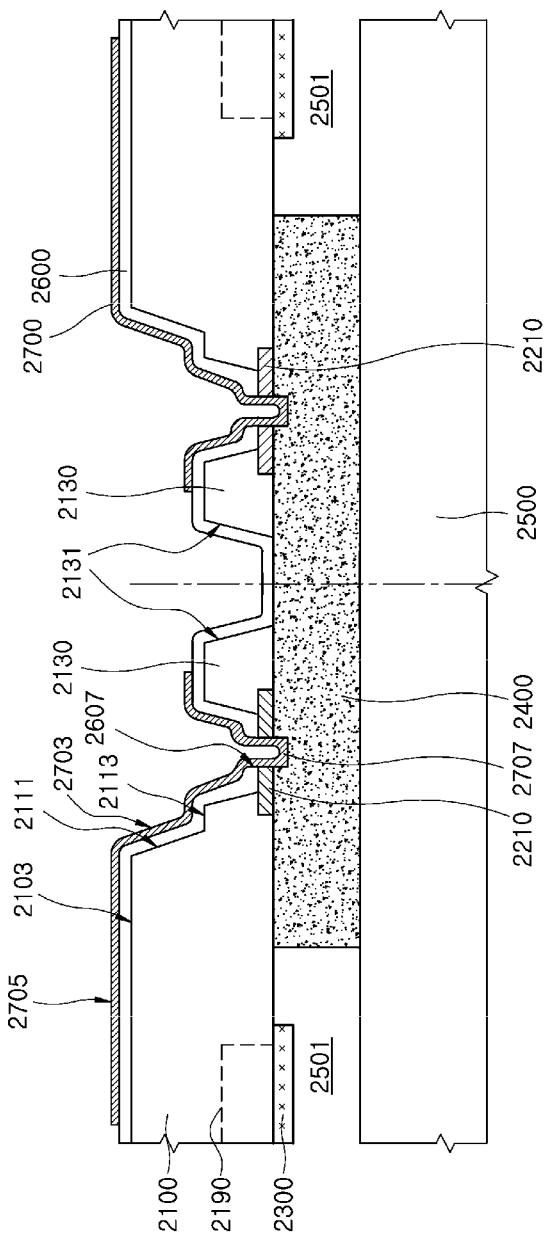

FIG. 24 illustrates a step of forming the redistribution lines 2700 and the conductive through vias 2707.

Referring to FIG. 24, an electroplating layer may be formed on portions of the first conductive layer (2701 of FIG. 23) exposed by the electroplating mask (2709 of FIG.

23), and the electroplating mask 2709 and the first conductive layer 2701 under the electroplating mask 2709 may be selectively removed to form second conductive patterns 2700, 2707 and 2705. The second conductive patterns 2707 may be formed in the second via holes 2607 to act as the conductive through vias electrically connected to the bonding pads 2210. The second conductive patterns 2700 may be formed to act as the redistribution lines electrically connected to the conductive through vias 2707. The second conductive patterns 2705 may be formed to act as solder pads electrically connected to the redistribution lines 2700. Although the present embodiment is described in conjunction with an example in which the second conductive patterns 2700, 2707 and 2705 are formed using an electroplating process, embodiments are not limited thereto. For example, in some embodiments, the second conductive patterns 2700, 2707 and 2705 may be formed by patterning a metal layer with a photolithography process and an etch process.

Figure 25:
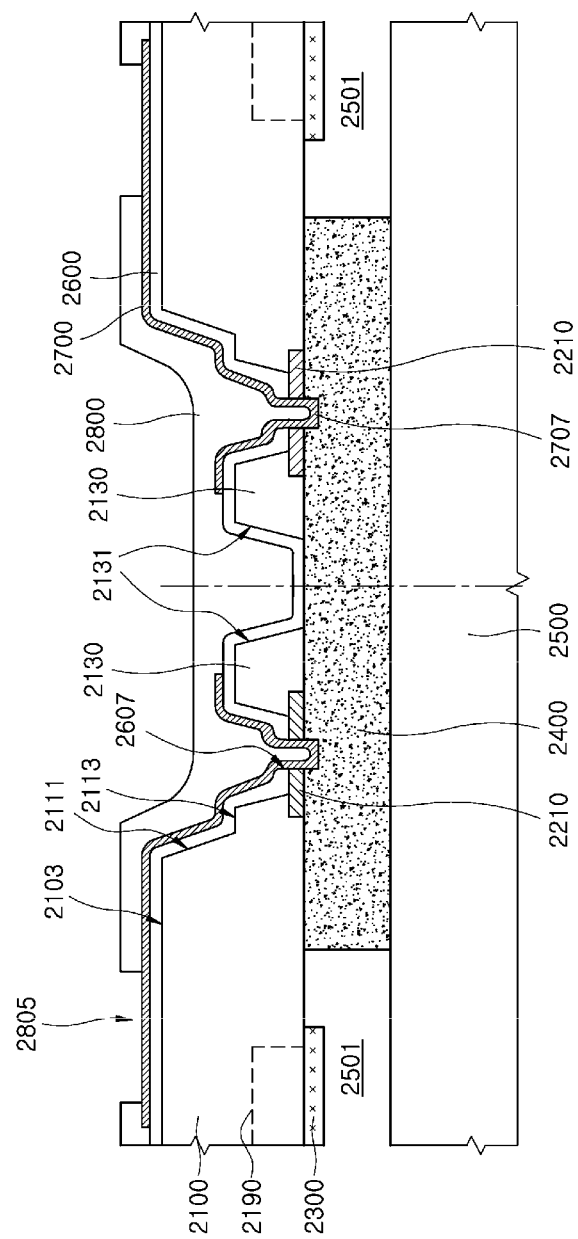

FIG. 25 illustrates a step of forming a second dielectric layer 2800 that covers the redistribution lines 2700 and the conductive through vias 2707.

Referring to FIG. 25, the second dielectric layer 2800 may be formed on the first dielectric layer 2600 to cover the redistribution lines 2700 and the conductive through vias 2707. The second dielectric layer 2800 may also be formed to cover the outer sidewalls 2131 of the terrace portions 2130. The second dielectric layer 2800 may be formed to have openings 2805 that expose the solder pads 2705.

Figure 26:
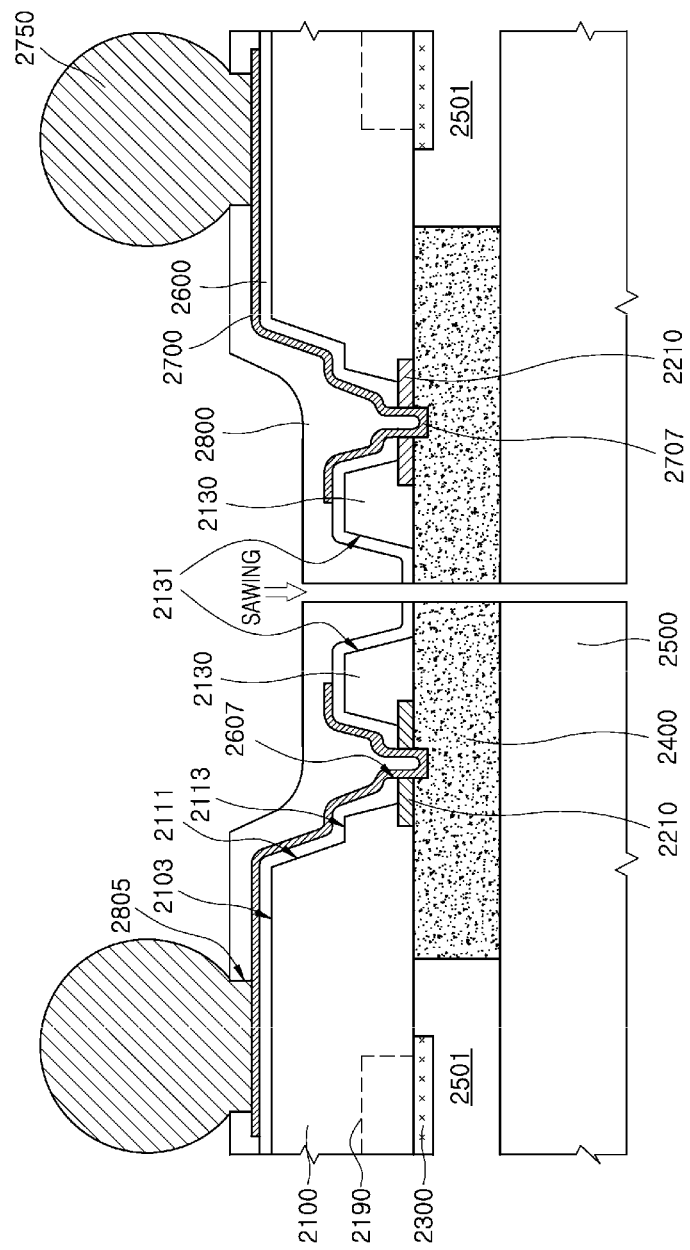

FIG. 26 illustrates a step of separating the image sensor dies.

Referring to FIG. 26, external connection members such as solder balls 2750 may be formed on the solder pads 2705 exposed by the openings 2805. Subsequently, a border region between the dies may be cut using a die sawing process to separate the dies from each other. That is, the second dielectric layer 2800, the first dielectric layer 2600, the support structure 2400 and the optical lid 2500 in the border region between the dies may be selectively removed using a die sawing process to form a plurality of separate image sensor packages.

Although FIGS. 11 to 26 illustrate an embodiment in which both the first and second dielectric layers 2600 and 2800 are formed to cover the outer sidewalls 2131 of the terrace portions 2130, embodiments are not limited thereto. For example, in some embodiments, at least one of the first and second dielectric layers 2600 and 2800 may be formed to cover the outer sidewalls 2131 of the terrace portions 2130.

Figure 27:
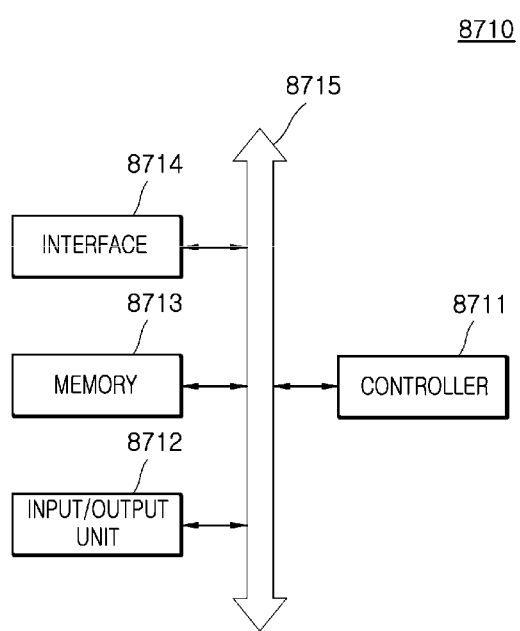
FIG. 27 is a block diagram illustrating an electronic system including a package according to an embodiment.

FIG. 27 is a block diagram illustrating an electronic system 8710 including at least one of the image sensor packages according to some embodiments. The electronic system 8710 may include a controller 8711, an input/output device 8712, and a memory 8713. The controller 8711, the input/output device 8712 and the memory 8713 may be coupled with one another through a bus 8715 providing a path through which data moves. The input/output device 8712 may include the image sensor package according to embodiments to generate electrical image data.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system such as of CDMA (code division multiple access), GSM (global system for mobile communications), NADC (north American digital cellular), E-TDMA (enhanced-time division multiple access), WCDAM (wideband code division multiple access), CDMA2000, LTE (long term evolution) and Wibro (wireless broadband Internet)

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. An image sensor package comprising:
   an image sensor die having an active side surface, a backside surface opposite to the active side surface, a die body portion, a terrace portion thinner than the die body portion, and a bonding pad disposed on the active side surface;
   a through via penetrating the terrace portion and being electrically connected to the bonding pad;
   a first dielectric layer disposed between the through via and the terrace portion, the first dielectric layer covering backside surfaces of the die body portion and the terrace portion;
   a redistribution line disposed on the first dielectric layer and electrically connected to the through via, the redistribution line extending over a portion of the first dielectric layer on the backside surface of the terrace portion;
   a second dielectric layer disposed on the first dielectric layer, the second dielectric layer covering the redistribution line and covering an outer sidewall between the active side surface and a backside surface of the terrace portion,
   an optical lid over the active side surface of the image sensor die; and
   a dam-like support structure attached between the optical lid and the active side surface of the terrace portion, wherein the dam-like support structure includes a groove in an edge portion of an interface between the dam-like support structure and the active side surface of the terrace portion, wherein the second dielectric layer extends from the outer sidewall of the terrace portion into the groove to cover the edge portion of the interface, and wherein the active side surface includes an image sensor device region wherein the active side surface includes an image sensor device region.

2. The image sensor package of claim 1, wherein the first dielectric layer extends between the dam-like support structure and a portion of the second dielectric layer covering the sidewall of the terrace portion.

3. The image sensor package of claim 1, further comprising an outer tail portion that laterally protrudes from a lower portion of the sidewall of the terrace portion over the dam-like support structure, and a thickness of the outer tail portion is less than a thickness of the terrace portion.

4. The image sensor package of claim 1, wherein the dam-like support structure is extended to cover the bonding pad.

5. The image sensor package of claim 4,
wherein the through via penetrates the bonding pad and contacts the dam-like support structure, and
wherein the through via is disposed in a via hole passing through the bonding pad.

6. The image sensor package of claim 1, further comprising a cavity disposed between the optical lid and the active side surface of the die body portion, and a depth of the cavity is defined by a thickness of the dam-like support structure.

7. The image sensor package of claim 6, further comprising a color filter array that is disposed on the image sensor device region in the cavity.

8. The image sensor package of claim 1, wherein the dam-like support structure includes an epoxy resin material, a polyimide material, a photoresist material or a solder resist material.

9. The image sensor package of claim 1, wherein the first dielectric layer includes an insulation layer containing silicon.

10. The image sensor package of claim 1, wherein the second dielectric layer has an opening that exposes a solder pad portion corresponding to a portion of the redistribution line, and the image sensor package further comprises a solder ball attached to the solder pad portion.

* * * * *

UNITED STATES PATENT AND TRADEMARK OFFICE
CERTIFICATE OF CORRECTION

PATENT NO.          : 9,640,580 B2
APPLICATION NO.     : 14/788666
DATED               : May 2, 2017
INVENTOR(S)         : Seung Hyun Lee and Na Yeon Kim Page 1 of 1

It is certified that error appears in the above-identified patent and that said Letters Patent is hereby corrected as shown below:

In the Claims

In Column 21, Claim 1, Delete Lines 11-12, "wherein the active side surface includes an image sensor device region".

Signed and Sealed this
Tenth Day of April, 2018

Andrei Iancu
*Director of the United States Patent and Trademark Office*